United States Patent
Rupp et al.

(10) Patent No.: US 10,049,914 B2
(45) Date of Patent: Aug. 14, 2018

(54) METHOD FOR THINNING SUBSTRATES

(71) Applicant: Infineon Technologies AG, Neubiberg (DE)

(72) Inventors: Roland Rupp, Erlanden (DE); Hans-Joachim Schulze, Taufkirchen (DE); Francisco Javier Santos Rodriguez, Villach (AT); Iris Moder, Villach (AT); Ingo Muri, Villach (AT)

(73) Assignee: Infineon Technologies AG, Neubiberg (DE)

( * ) Notice: Subject to any disclaimer, the term of this patent is extended or adjusted under 35 U.S.C. 154(b) by 47 days.

(21) Appl. No.: 14/946,886

(22) Filed: Nov. 20, 2015

(65) Prior Publication Data
US 2017/0148664 A1   May 25, 2017

(51) Int. Cl.
| | | |
|---|---|---|
| *H01L 21/20* | (2006.01) | |
| *H01L 21/762* | (2006.01) | |
| *H01L 21/265* | (2006.01) | |
| *H01L 21/306* | (2006.01) | |
| *H01L 21/324* | (2006.01) | |

(52) U.S. Cl.
CPC .. *H01L 21/76243* (2013.01); *H01L 21/26533* (2013.01); *H01L 21/30625* (2013.01); *H01L 21/324* (2013.01)

(58) Field of Classification Search
CPC ......... H01L 21/76243; H01L 21/26533; H01L 21/30625
See application file for complete search history.

(56) References Cited

U.S. PATENT DOCUMENTS

| | | | |
|---|---|---|---|
| 9,514,987 B1 * | 12/2016 | Gambino | H01L 21/76898 |
| 2004/0248390 A1 | 12/2004 | Attenberger et al. | |
| 2013/0140667 A1 * | 6/2013 | Kalnitsky | H01L 21/823481 |
| | | | 257/499 |
| 2015/0236142 A1 * | 8/2015 | Laven | H01L 21/2254 |
| | | | 257/66 |

OTHER PUBLICATIONS

Pan et al. "Reactive Ion Etching of Sputtered Silicon Carbide and Tungsten Thin Films for Device Applications", 1989, 189 pages.

* cited by examiner

*Primary Examiner* — Bradley K Smith
(74) *Attorney, Agent, or Firm* — Viering, Jentschura & Partner mbB

(57) ABSTRACT

According to various embodiments, a method may include: providing a substrate having a first side and a second side opposite the first side; forming a buried layer at least one of in or over the substrate by processing the first side of the substrate; thinning the substrate from the second side of the substrate, wherein the buried layer includes a solid state compound having a greater resistance to the thinning than the substrate and wherein the thinning stops at the buried layer.

17 Claims, 11 Drawing Sheets

METHOD FOR THINNING SUBSTRATES

TECHNICAL FIELD

Various embodiments relate generally to a method for substrate thinning

BACKGROUND

In general, semiconductor materials may be processed in semiconductor technology on or in a substrate (also referred to as a wafer or a carrier), e.g. to fabricate integrated circuits (also referred as to chips). During processing the semiconductor materials certain process steps may be applied, such as thinning the substrate or forming one or more layers over the substrate.

Thinning the substrate may include removing material from a backside of the substrate. The remaining thickness of the thinned substrate is a critical parameter which influences among other parameters the robustness against electrical short circuits, e.g. due to the resulting distance between emitter and field stop zone in insulated-gate bipolar transistors (IGBT). Therefore, a precise adjustment for the thinning is a key parameter for controlling the performance and reliability of the readily processed chips.

In further processing of the semiconductor material, certain impurity atoms may diffuse out of the substrate, e.g. nitrogen or oxygen. Since the presence and concentration of the impurity atoms influence the electrical properties of certain active regions of the substrate, e.g. the drift zone of an IGBT, this may impair the performance of the readily processed chips. For example, reduced oxygen may lead to thermal donors and reduced nitrogen may reduce the doping of the drift zone or the doping of the field stop zone.

Conventionally, for thinning the substrate (thinning process) grinding in combination with etching is used, or, if more accurate control of wafer thickness is needed, electrochemical etching is used. The electrochemical etching is self-adjusting with respect to the border of a space charge region. Such conventional processes are very sensitive in their preciseness. For example, the doping level influences the extent of the space charge region such that the self-adjusting cannot be sufficiently precise. Therefore, conventional methods require extreme effort to realize a precise self-adjustment effect.

SUMMARY

According to various embodiments, a method may include: providing a substrate having a first side and a second side opposite the first side; forming a buried layer at least one of in or over the substrate by processing the first side of the substrate; thinning the substrate from the second side of the substrate, wherein the buried layer may include a solid state compound having a greater resistance to the thinning than the substrate and wherein the thinning stops at the buried layer.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

Figure 1A:
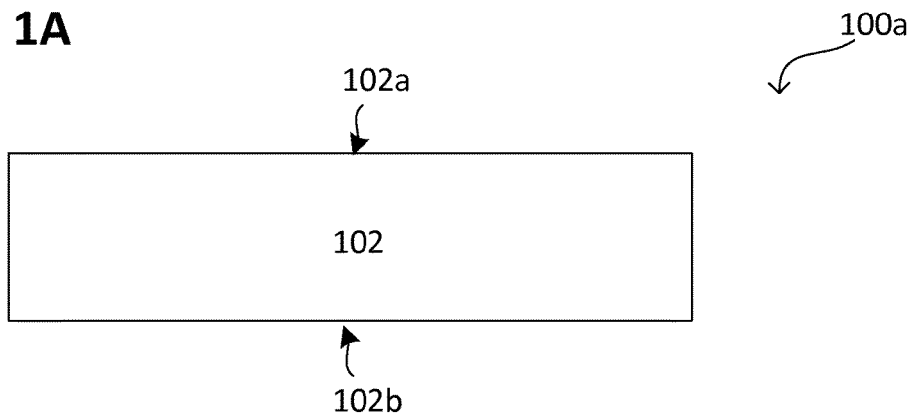
FIG. 1A to FIG. 1C respectively show a method according to various embodiments.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

The term "lateral" used with regards to the "lateral" extension of a structure (or of a substrate, a wafer, or a carrier) or "laterally" next to, may be used herein to mean an extension or a positional relationship along a surface of a substrate, a wafer, or a carrier. That means that a surface of a substrate (e.g. a surface of a carrier, or a surface of a wafer) may serve as reference, commonly referred to as the main processing surface of the substrate (or the main processing surface of the carrier or wafer). Further, the term "width" used with regards to a "width" of a structure (or of a structure element) may be used herein to mean the lateral extension of a structure. Further, the term "height" used with regards to a height of a structure (or of a structure element), may be used herein to mean an extension of a structure along a direction perpendicular to the surface of a substrate (e.g. perpendicular to the main processing surface of a substrate). The term "thickness" used with regards to a "thickness" of a layer may be used herein to mean the spatial extension of the layer perpendicular to the surface of the support (the material) on which the layer is deposited. If the surface of the support is parallel to the surface of the substrate (e.g. to the main processing surface) the "thickness" of the layer deposited on the support may be the same as the height of the layer. Further, a "vertical" structure may be referred to as a structure extending in a direction perpendicular to the lateral direction (e.g. perpendicular to the main processing surface of a substrate) and a "vertical" extension may be referred to as an extension along a direction perpendicular to the lateral direction (e.g. an extension perpendicular to the main processing surface of a substrate).

According to various embodiments, the substrate may include one or more integrated circuits (also referred to as semiconductor chip, IC, chip, or microchip) which are formed during a method according to various embodiments (also referred as to integrated circuit fabrication). An integrated circuit may be processed at least partially at least one of over or in the substrate in corresponding regions of the substrate (also referred to as active chip regions, e.g. by processing a main processing surface of the substrate) utilizing various semiconductor processing technologies. An integrated circuit may include one or more (e.g. a plurality of) electrical circuit components, such among others may be at least one of transistors, resistors, capacitors, which are electrically interconnected and configured to perform operations, e.g. computing or storage operations, in the completely processed integrated circuit. At least one integrated circuit may be part of a semiconductor device formed in or over the substrate.

In a further step of the method a plurality of semiconductor devices may be singulated from the substrate after the integrated circuit fabrication by wafer-dicing to provide a plurality of singulated semiconductor devices (also referred to as semiconductor chips) from the plurality of semiconductor devices of the substrate. Further, a final stage of semiconductor device fabrication may include packaging (also referred to as assembly, encapsulation, or seal) of singulated semiconductor devices, wherein a singulated semiconductor device may be encased, e.g. into a supporting material (also referred to encapsulation material) to prevent physical damage and/or corrosion of the semiconductor device. The supporting material encases the semiconductor device (illustratively, forms a package or mold) and may optionally support the electrical contacts and/or a lead frame to connect the semiconductor device to a peripheral device, e.g. to a circuit board.

According to various embodiments, a reproducible thinning process may be provided, which reduces variations of the thinned substrates in their thickness. Therefore, a self-adjusting thinning process is provided by forming a buried layer at which the thinning stops. The remaining source for variations of the thinned substrates in their thickness are further process steps, e.g. the formation of an epitaxial layer.

According to various embodiments, a temperature stable buried layer may be provided, which on the one hand may be used as thinning stop (in other words, to stop a thinning procedure) and on the other hand may be used as barrier layer, e.g. as barrier against diffusion (in other words, diffusion barrier), e.g. for preventing impurity atoms like at least one of oxygen or nitrogen to pass the buried layer. Using the buried layer as thinning stop may include using the buried layer as etch stop.

According to various embodiments, the buried layer may include or be formed from a solid state compound including at least one chemical element (e.g. at least one of carbon, nitrogen) having a greater electronegativity than the substrate, or semiconductor material (e.g. Si). For example, the buried layer (e.g. the solid state compound) may include or be formed from at least one of a carbide or a nitride of the semiconductor material, e.g. at least one of silicon carbide or silicon nitride. The buried layer may be formed by implanting the chemical element (e.g. at least one of carbon or nitrogen) having a greater electronegativity than the semiconductor material (also referred to as the chemical element) into the semiconductor material, in other words, by ion implantation (see FIG. 4B). For ion implantation the substrate may be irradiated with ions (e.g. at least one of carbon ions or nitrogen ions) of the chemical element having a greater electronegativity than the semiconductor material.

According to various embodiments, an implantation dose (defining an concentration of the implemented atoms of the chemical element) of the buried layer may be in the range from about $10^{15}$ atoms of the chemical element per $cm^2$ to about $10^{18}$ atoms of the chemical element per $cm^2$, e.g. in the range from about $10^{16}$ atoms of the chemical element per $cm^2$ to about $10^{17}$ atoms per $cm^2$. In other words, a dose of the atoms of the chemical element of the buried layer may be in the range from about $10^{15}$ atoms of the chemical element per $cm^2$ to about $10^{18}$ atoms of the chemical element per $cm^2$, e.g. in the range from about $10^{16}$ atoms of the chemical element per $cm^2$ to about $10^{17}$ atoms of the chemical element per $cm^2$. The dose of these atoms may referred to a surface of the substrate, e.g. defining a concentration of the atoms of the chemical element in projection to the surface of the substrate.

For example, an implantation dose (defining an concentration of the implemented atoms) of the buried layer may be in the range from about $10^{15}$ carbon atoms per $cm^2$ to about $10^{18}$ carbon atoms per $cm^2$, e.g. in the range from about $10^{16}$ carbon atoms per $cm^2$ to about $10^{17}$ carbon atoms per $cm^2$. In other words, a dose of carbon of the buried layer may be in the range from about $10^{15}$ carbon atoms per $cm^2$ to about $10^{18}$ carbon atoms per $cm^2$, e.g. in the range from about $10^{16}$ carbon atoms per $cm^2$ to about $10^{17}$ carbon atoms per $cm^2$. The dose of carbon may referred to a surface of the substrate, e.g. defining a concentration of carbon in projection to the surface of the substrate.

For example, an implantation dose of the buried layer may be in the range from about $10^{15}$ nitrogen atoms per $cm^2$ to about $10^{18}$ nitrogen atoms per $cm^2$, e.g. in the range from about $10^{16}$ nitrogen atoms per $cm^2$ to about $10^{17}$ nitrogen atoms per $cm^2$. In other words, a dose of nitrogen of the buried layer may be in the range from about $10^{15}$ nitrogen atoms per $cm^2$ to about $10^{18}$ nitrogen atoms per $cm^2$, e.g. in the range from about $10^{16}$ nitrogen atoms per $cm^2$ to about $10^{17}$ nitrogen atoms per $cm^2$. The dose of nitrogen may referred to a surface of the substrate, e.g. defining a concentration of nitrogen in projection to the surface of the substrate.

An energy (also referred as to implantation energy) of implanting the chemical element (e.g. at least one of carbon or nitrogen), may be adjusted such that the penetration depth of the chemical element (e.g. at least one of carbon or nitrogen) is sufficient to achieve over the end-of-range (illustratively, the upper interface of the spatially distributed buried layer at a certain penetration depth) an undisturbed layer (also referred as to cover layer) including semiconductor material (e.g. silicon). After implanting the chemical element (e.g. at least one of carbon or nitrogen), one or more tempering steps may be applied, e.g. including at least one of heating the substrate, heating the buried layer. In the one or more tempering steps the buried layer may be activated. For example, at least one of the following may be activated: a diffusion of the chemical element (e.g. at least one of carbon or nitrogen) of the buried layer; or chemical bonding of the chemical element (e.g. at least one of carbon or nitrogen) of the buried layer, e.g. to form the solid state compound (e.g. at least one of a carbide or nitride) in the buried layer.

Diffusion of the chemical element (e.g. at least one of carbon or nitrogen) of the buried layer may be configured to a maximum diffusion length in the range from about 1 angstrom to about 10 nm. This may facilitate chemical bonding of the chemical element (e.g. at least one of carbon or nitrogen), e.g. with material of the substrate, to form the buried layer.

The buried layer may provide sufficient properties regarding serving as thinning stop or serving as barrier, even if the buried layer may be partially imperfect, e.g. including defects. To reduce the imperfection of the buried layer, higher temperatures may be used for the one or more tempering steps. A high temperature ramp rate may be used to minimize dilution of the implanted atoms (species). Alternatively or additionally, the one or more tempering steps may provide to reduce defects in the substrate (e.g. caused by the ion irradiation), e.g. defects in the cover layer (including or formed from a first portion of the substrate).

Alternatively or additionally, forming a buried layer, e.g. implanting the chemical element (e.g. at least one of carbon or nitrogen) into the substrate, may be configured to form a buried layer including a plurality of segments (illustratively, island-like or stripe-like segments). Alternatively or additionally, the buried layer may include a plurality of openings extending through the buried layer. For example, the plurality of openings may separate the plurality of segments from each other. The plurality of segments may be spatially separated from each other. The plurality of segments may be formed by at least one of disposing or implanting the chemical element (e.g. at least one of carbon or nitrogen) into a plurality of trenches (see FIG. 7B). This may enable to dispose the buried layer 104 deeper in the substrate 102.

According to various embodiments, the buried layer may serve as barrier against a diffusion of impurity atoms. In other words, the buried layer may avoid the diffusion of impurity atoms through the buried layer since a diffusion coefficient of the impurity atoms in the buried layer may be smaller than a diffusion coefficient of the impurity atoms in the material of the substrate, e.g. the semiconductor material of the substrate. The buried layer may be effective against oxygen and also other impurities.

For enhancing the effectiveness of the buried layer serving as a barrier, e.g. diffusion barrier, the buried layer may be formed as continuous buried layer. For using the buried layer as thinning stop the buried layer may not be necessarily continuous. For using the buried layer as thinning stop the buried layer may include at least one of a plurality of segments, or a plurality of openings without impairing the effectiveness of the buried layer serving as thinning stop. For example, thinning the substrate may include or be formed from grinding and (e.g. simultaneously) etching, e.g. at least one of dry etching (like plasma etching, ion etching, e.g. reactive ion etching), or wet etching (e.g. chemical-mechanical polishing or chemical-mechanical planarization). Alternatively or additionally, thinning the substrate may include grinding using an abrasive, wherein a hardness of the abrasive may be greater than a hardness of a material of the substrate (e.g. a semiconductor material like Si) and smaller than a hardness of the buried layer 104. This may result in the buried layer 104 having a greater mechanical resistance than the substrate 102 to the grinding.

According to various embodiments, a p-doped sublayer may be provided, e.g. by sequentially implanting a further chemical element, e.g. a p-dopant (e.g. boron) into at least one of: the substrate or the buried layer. For example, the p-doped sublayer may be disposed between at least two sublayers, each including the chemical element (e.g. at least one of carbon or nitrogen). This may reduce diffusion of the p-dopant into the substrate.

The p-doped sublayer may provide a high doped region at least one of in the buried layer or between two sublayers, e.g. the two sublayers each having a small thickness. According to various embodiments, a concentration of the p-doped sublayer may be in the range from about $10^{15}$ p-dopant atoms per $cm^3$ to about $10^{18}$ p-dopant atoms per $cm^3$, e.g. in the range from about $10^{16}$ p-dopant atoms per $cm^3$ to about $10^{17}$ p-dopant atoms per $cm^3$. In other words, a concentration of p-dopant of the p-doped sublayer may be in the range from about $10^{15}$ p-dopant atoms per $cm^3$ to about $10^{18}$ p-dopant atoms per $cm^3$, e.g. in the range from about $10^{16}$ p-dopant atoms per $cm^3$ to about $10^{17}$ p-dopant atoms per $cm^3$. The concentration of p-dopant atoms may referred to a surface of the substrate, e.g. in projection to the surface of the substrate.

The p-doped sublayer may be used as thinning stop, e.g. as etch stop. Using the p-doped sublayer may provide a reduction of the implantation concentration of the chemical element (e.g. at least one of carbon or nitrogen) for forming the buried layer.

According to various embodiments, a method may provide forming a buried layer. The buried layer may be temperature stable. Alternatively or additionally, the buried layer may provide at least one of: a thinning stop or a barrier. Optionally, the method may include forming an epitaxial layer over the substrate. Optionally, the method may include forming one or more circuit components at least one of in or over the substrate, e.g. in or over the epitaxial layer. The one or more circuit components may include or be formed from one or more power circuit components, e.g. one or more power transistors. Optionally, the method may include removing the buried layer at least partially (in other words, partially or completely) after thinning the substrate (e.g. using etching, e.g. at least one of dry etching or wet etching). Optionally, the method may further include additional process steps (like e.g. backside implantation and subsequent annealing steps), e.g. after forming the buried layer.

Removing the buried layer partially may include removing at least a portion (e.g. a sublayer) of the buried layer. Removing at least a portion the buried layer may include exposing a further portion (e.g. a further sublayer) of the buried layer 104 (see for example, FIG. 11C). Removing the buried layer partially may include exposing a backside of the substrate (e.g. if openings are formed in the buried layer).

Alternatively or additionally, removing the buried layer at least partially may include removing the buried layer completely. Removing the buried layer completely may include exposing a portion of the substrate (e.g. completely).

Optionally, the method may include electrically contacting (in other words, providing an ohmic contact to) the substrate at its thinned side (the backside of the substrate, also referred as to second side). The electrically contact may be formed in physical contact to at least one of a cover layer (including at least one of a first portion of the substrate; an epitaxial layer); a sublayer of the buried layer.

Figure 1B:
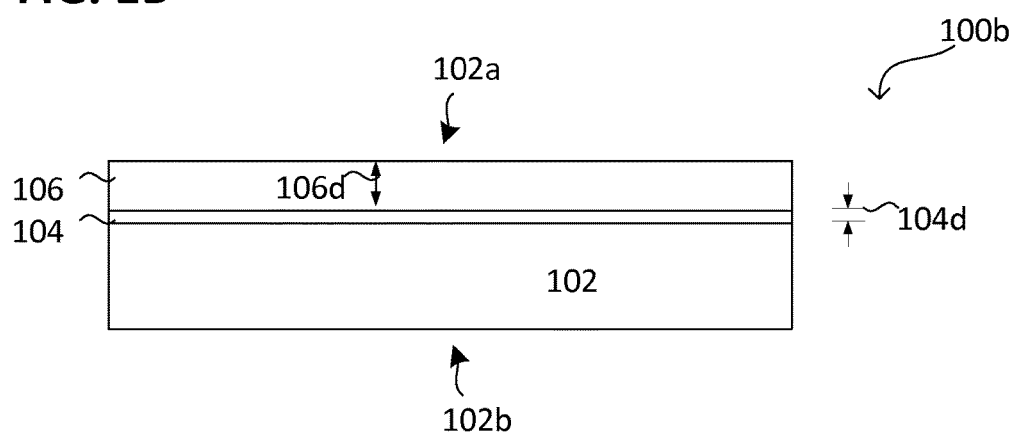
Figure 1C:
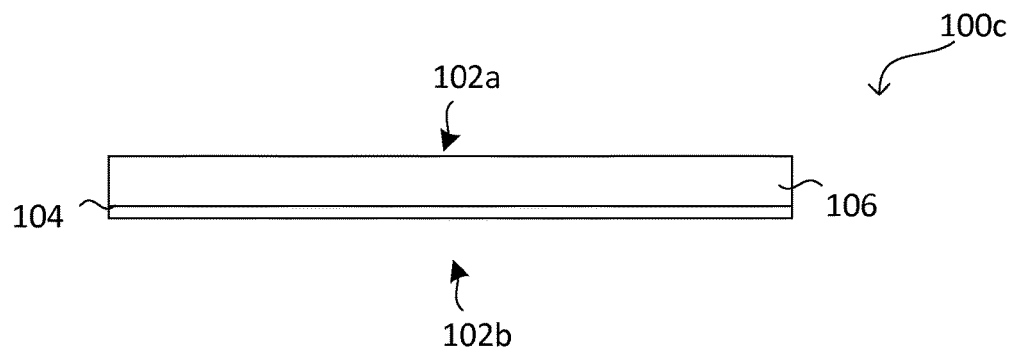

FIG. 1A, FIG. 1B, and FIG. 1C respectively illustrate a method according to various embodiments. The method may include in 100a providing a substrate 102 having a first side 102a and a second side 102b opposite the first side 102a. The first side 102a and the second side 102b may be understood as general sides, referring not only to the substrate 102. On the first side 102a the substrate 102 may include a main processing surface. The method may include in 100b forming a buried layer 104 at least one of in or over the substrate 102 by processing the first side 102a of the substrate 102, wherein the buried layer 104 includes or is formed from the chemical element (e.g. at least one of carbon or nitrogen). The buried layer 104 may be proximate the first side 102a of the substrate 102.

For example, processing the first side 102a of the substrate 102 may include disposing the substrate 102 with the first side 102a directed to (in other words, facing) a first process region and forming the buried layer 104 using a first process provided by the first process region. The first process may be configured to transfer the chemical element (e.g. at least one of carbon or nitrogen) at least one of into or over the substrate 102.

For example, the first process may include or be formed from an ion implantation process (see for example, FIG. 4B), configured to implant ions of the chemical element, e.g. at least one of carbon ions or nitrogen ions, into the substrate 102, e.g. be irradiation the substrate 102 (e.g. on the first side 102a) with the ions of the chemical element. In other words, the first side 102a of the substrate 102 may be exposed to an ion current including the ions of the chemical element (e.g. at least one of carbon ions or nitrogen ions). Optionally, implanting ions into the substrate 102 may include forming a plurality of trenches (see for example, FIG. 7B) in the substrate and implanting ions of the chemical element having a higher electronegativity than the substrate into the substrate 102 through the plurality of trenches.

If forming the buried layer 104 includes implanting ions into the substrate, a layer 106 covering the buried layer 104 (cover layer 106) may include or be formed from a first portion of the substrate 102.

The thickness of the cover layer 106 (e.g. a thickness of the first portion of the substrate 102) may be in the range from about 50 nm to about 500 nm, e.g. in the range from about 100 nm to about 250 nm. The thickness of the buried layer 104 may be in the range from about 10 nm to about 100 nm, e.g. in the range from about 20 nm to about 50 nm.

Alternatively or additionally, the first process may include a deposition process (e.g. sputtering, plasma deposition or atomic layer deposition) configured to deposit a first material including the chemical element (e.g. at least one of carbon or nitrogen) at least one over or into the substrate 102. Depositing the first material into the substrate 102 may include forming a plurality of trenches in the substrate 102 (see for example, FIG. 7B) and disposing the first material in the plurality of trenches. Depositing the first material over the substrate 102 may include disposing the first material over a surface of the substrate 102 on the first side 102a, e.g. over the main processing surface. The first material may include the chemical element (e.g. at least one of carbon or nitrogen), e.g. including or formed from the solid state compound, e.g. at least one of a nitride (e.g. silicon nitride-SiN) or a carbide (e.g. silicon carbide-SiC). For example, the first material may include or be formed from a donor material, e.g. donating the chemical element (e.g. at least one of carbon or nitrogen) to the substrate 102, e.g. if activated, e.g. be heating the first material to a donating temperature.

Optionally, the first process may include a deposition process configured to deposit a second material over the substrate 102 (e.g. filling the plurality of trenches if present), e.g. over the buried layer 104. The second material may include or be formed from a material of the substrate 102, e.g. a semiconducting material (e.g. silicon) of the substrate 102. The second material may be formed epitaxial over the substrate (in other words, an epitaxial layer may be formed). The phrase "epitaxial" may be understood as relating to an orientation of the crystal of the substrate 102. A layer or material may be epitaxial if an orientation of the crystal of the layer or material is in the same structural orientation like the orientation of the crystal of the substrate 102. If the substrate 102 and the second material include the same material, the first process may be configured to form the second material homoepitaxial over the substrate 102.

If forming the buried layer 104 includes depositing the second material over the substrate 102, the layer 106 covering the buried layer 104 may include or be formed from the second material.

Further, the method may include in 100c thinning the substrate 102 from the second side 102b of the substrate 102, wherein the thinning stops at the buried layer 104.

Thinning the substrate 102 may include disposing the substrate 102 with the second side 102b of the substrate 102 directed to a second process region and thinning the substrate 102 using a second process provided by the second process region, wherein the second process is configured to stop at the buried layer 104. The second process may include or be formed from an etching process.

Thinning the substrate 102 (e.g. using the second process) may include etching the substrate 102 from the second side 102b of the substrate 102 (in other words, etching the second side 102b of the substrate 102). Optionally, the etching is configured as anisotropic etching, e.g. if (see for example, FIG. 7C) the buried layer 104 includes openings 504o (this may stop thinning at the buried layer 104 more reliable). Thinning the substrate 102 from the second side 102b of the substrate 102 (e.g. using the second process) may include using an etchant configured to etch the material of the substrate 102 (e.g. the semiconductor of the substrate) faster than the solid state compound of the buried layer 104 (e.g. at least one of a carbide or a nitride of the buried layer 104). For example, thinning the substrate 102 from the second side 102b of the substrate 102 may include using an etchant to which the buried layer 104 is substantially inert (partially inert or completely inert).

According to various embodiments, the etchant may include or be formed from at least one of an alkaline etchant (e.g. including at least one of an inorganic etchant or an organic etchant) or an acid etchant having an oxidizer, e.g. hydrofluoric acid (HF) /nitric acid ($HNO_3$) based).

After thinning the substrate 102, at least one of the cover layer 106 and the buried layer 104 may remain. The cover layer 106 may include or be formed from at least one of the first portion of the substrate 102; the second material, e.g. in form of an epitaxial layer (see for example, FIG. 11A).

Optionally, the method may include removing the buried layer 104 at least partially. After removing the buried layer 104 at least partially at least the cover layer 106 may remain.

According to various embodiments, etching may include at least one of: grinding, chemical-mechanical polishing, wet etching, electrochemical etching, dry etching, ion etching (e.g. reactive ion etching).

Figure 2A:
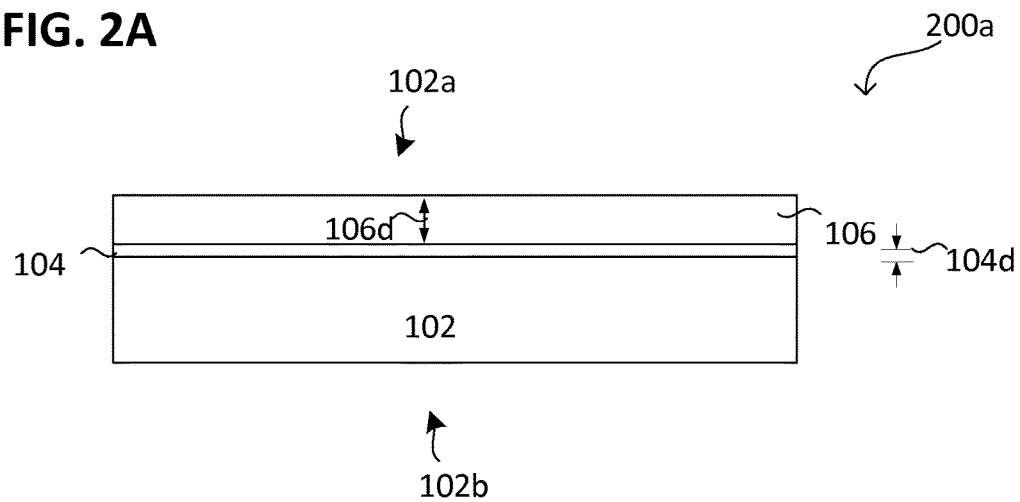
FIG. 2A to FIG. 2C respectively show a method according to various embodiments.
Figure 2B:
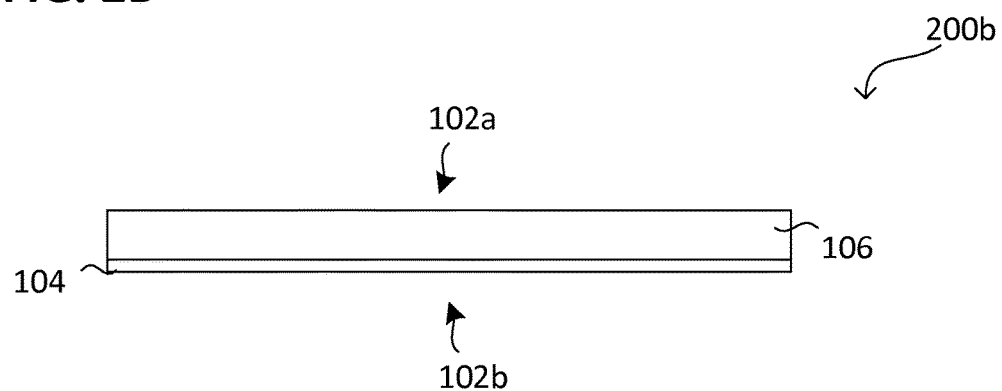
Figure 2C:
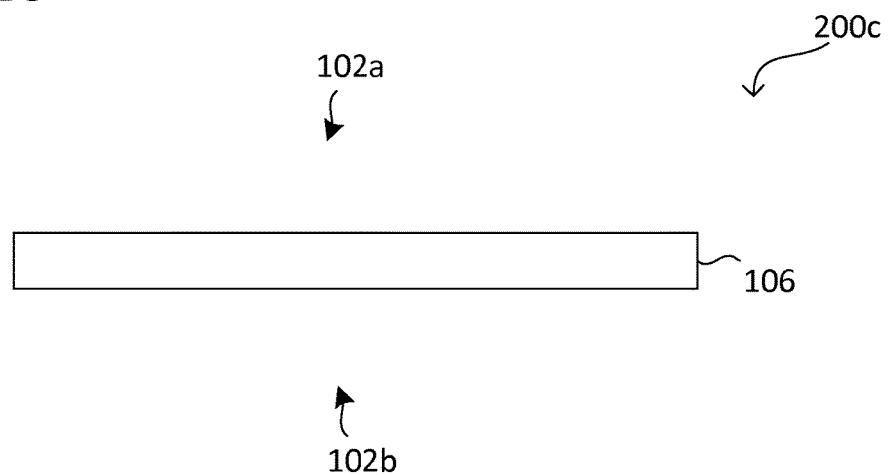

FIG. 2A, FIG. 2B and FIG. 2C respectively illustrate a method according to various embodiments. The method may include in 200a forming a buried layer 104 including the chemical element (e.g. at least one of carbon or nitrogen) at least one of in or over a substrate 102. Forming the buried layer 104 may be configured similar as in the method described before (see for example, step 100b). The buried layer 104 may be proximate the first side 102a of the substrate 102

The method may further include in 200b thinning the substrate 102, wherein the thinning stops at the buried layer 104. Thinning the substrate 102 may be similar as in the method described before (see for example, step 100c). The method may further include in 200c removing the buried layer 104 at least partially (e.g. partially or completely) after the thinning the substrate 102. In other words, at least a portion (e.g. a sublayer) of the buried layer 104 may be removed. Removing the buried layer 104 at least partially may include exposing a surface of the cover layer 106, e.g. on a second side 102 (similar oriented as the second side 102b of the substrate 102) of the cover layer 106. For example, removing the buried layer 104 partially may include opening the buried layer 104.

Figure 3A:
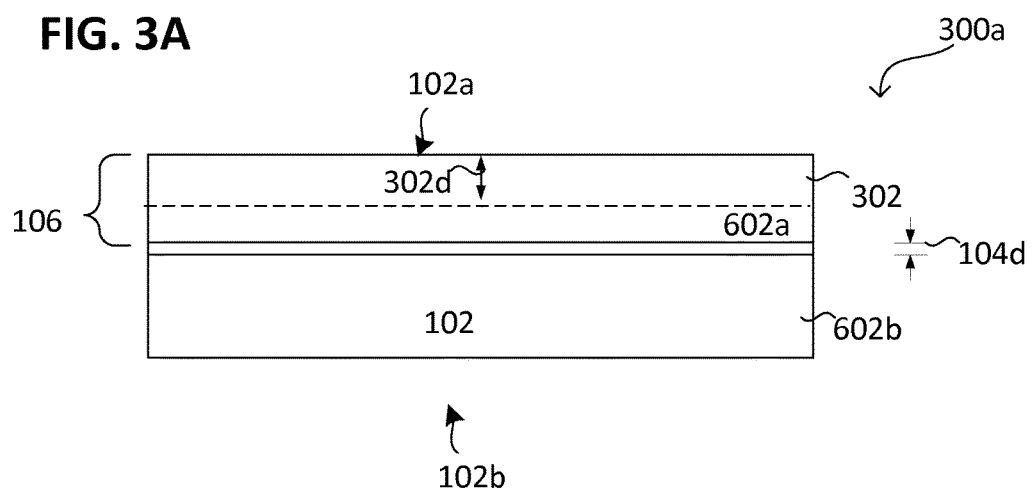
FIG. 3A to FIG. 3C respectively show a method according to various embodiments.
Figure 3B:
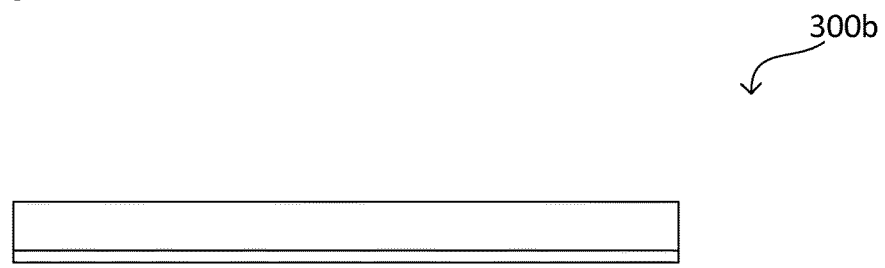
Figure 3C:

FIG. 3A, FIG. 3B and FIG. 3C respectively illustrate a method according to various embodiments. The method may include in 300a forming a layer arrangement, including a substrate 102, an epitaxial layer 302 over the substrate 102, and a buried layer 104 at least one of in the substrate 102 or between the substrate 102 and the epitaxial layer 302. The buried layer 104 may be proximate the first side 102a of the substrate 102 facing the epitaxial layer 302.

According to various embodiments, forming the layer arrangement may include forming a buried layer 104 including the chemical element (e.g. at least one of carbon or nitrogen). Forming the buried layer 104 may be configured similar as in the method described before (see for example, step 100b).

If the buried layer 104 is disposed in the substrate 102, a first portion 602a of the substrate 102 may be disposed between the buried layer 104 and the epitaxial layer 302. If the buried layer 104 is disposed between the substrate 102 and the epitaxial layer 302, the substrate 102 may be disposed opposite the epitaxial layer 302. At least one of the epitaxial layer 302 and the first portion 602a of the substrate 102 may cover 106 the buried layer 104.

Alternatively, the buried layer 104 may be formed in the epitaxial layer 302, e.g. using ion implantation (see FIG. 4B), e.g. before a further layer 508 (see FIG. 5B) is formed over the buried layer 104. This may reduce or suppress a diffusion of atoms from the substrate 102 into an electrical active region formed over the buried layer 104 (e.g. as part of the further layer 508). A distance of the buried layer 104 from an interface between the substrate 102 and the epitaxial layer 302 may still lead to some atoms diffusing from the region between the buried layer 104 and the interface into the electrical active region.

For example, forming the layer arrangement may include forming a layer (prior to forming the epitaxial layer 302), e.g. over the substrate 102; and forming the epitaxial layer 302 over the layer to bury the layer, in other words, to form the buried layer 104 from the layer. The layer may be formed using the first material, e.g. by depositing the first material on or over the substrate 102. The layer may include or be formed from the chemical element (e.g. at least one of carbon or nitrogen). The epitaxial layer 302 may be in physical contact with the buried layer 104.

Alternatively, forming the layer arrangement may include forming a buried layer 104 in the substrate 102 and forming the epitaxial layer 302 over the substrate 102, e.g. in physical contact with the substrate 102. In this case, the first portion 602a of the substrate 102 may be between the buried layer 104 and the epitaxial layer 302. Forming the buried layer 104 in the substrate 102 may be include at least one of implanting ions in the substrate 102; forming of plurality of trenches 704 (see FIG. 7B and FIG. 7C).

The method may further include in 300b thinning the substrate 102, wherein the thinning stops at the buried layer 104. Thinning the substrate 102 may be similar as in the method described before (see for example, step 100c). The method may optionally include in 300c removing the buried layer 104 at least partially (e.g. partially or completely) after the thinning Removing the buried layer 104 at least partially may be similar as in the method described before (see for example, step 200c). Alternatively or additionally, removing the buried layer 104 may include ion beam milling.

The thickness of the epitaxial layer 302 may be in the range from about 50 nm to about 500 nm, e.g. in the range from about 100 nm to about 250 nm. The thickness of the buried layer 104 (and the layer respectively) may be in the range from about 10 nm to about 100 nm, e.g. in the range from about 20 nm to about 50 nm.

Figure 4A:
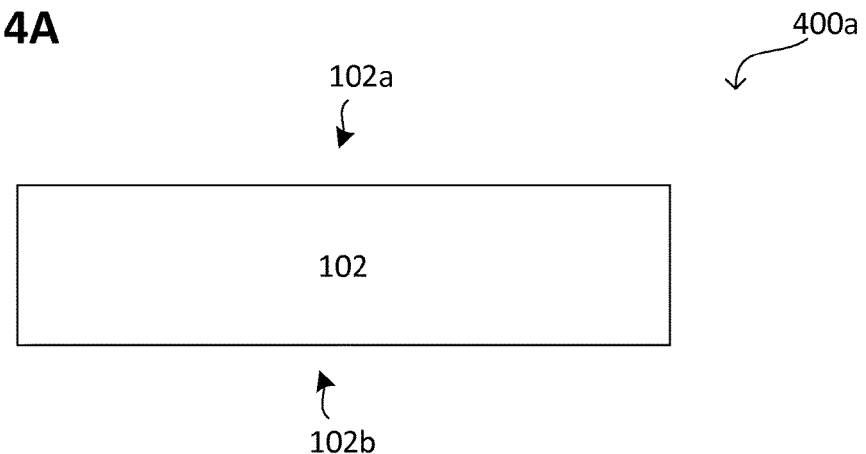
FIG. 4A to FIG. 4C respectively show a method according to various embodiments.
Figure 4B:
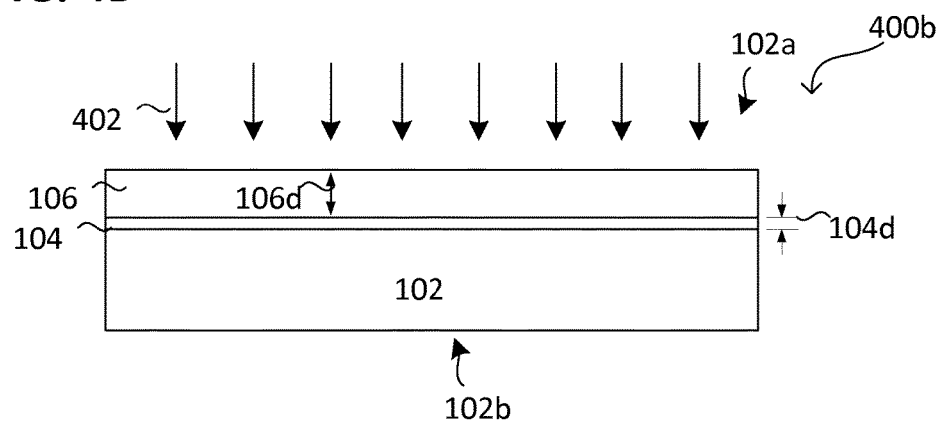
Figure 4C:
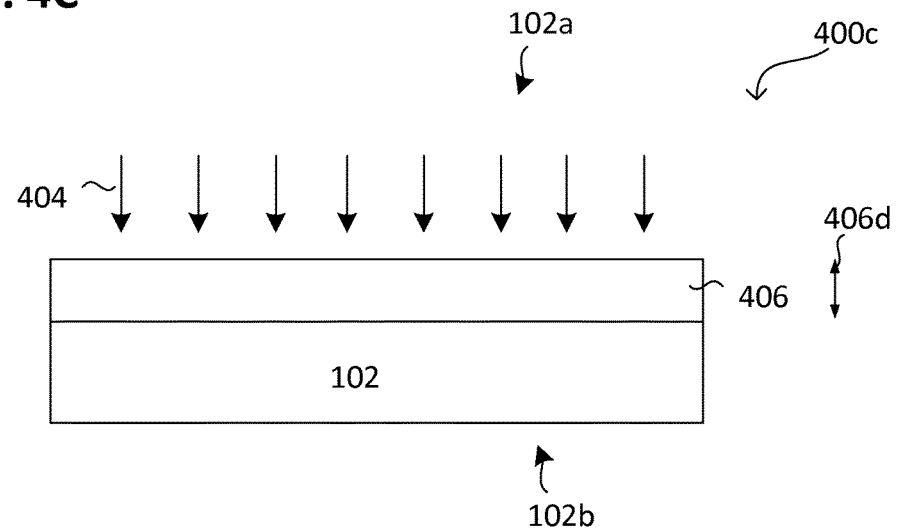

FIG. 4A, FIG. 4B and FIG. 4C respectively illustrate details to a method according to various embodiments.

According to various embodiments, providing a substrate 102 may in 400a include providing a substrate 102 (e.g. a wafer) including or made of (in other words formed from) semiconductor materials of various types, including a group IV semiconductor (e.g. silicon or germanium), a compound semiconductor, e.g. a group III-V compound semiconductor (e.g. gallium arsenide) or other types, including group III semiconductors, group V semiconductors or polymers, for example. In an embodiment, the substrate 102 is made of silicon (doped or undoped). In an alternative embodiment, the substrate 102 is a silicon on insulator (SOI) wafer. As an alternative, any other suitable semiconductor material may be used for the substrate 102, for example semiconductor compound material such as gallium phosphide (GaP), indium phosphide (InP), but also any suitable ternary semiconductor compound material or quaternary semiconductor compound material such as indium gallium arsenide (InGaAs).

According to various embodiments, forming a buried layer 104 may in 400b include using ion implantation. For ion implantation, the substrate 102 may be irradiated 402 with ions of the chemical element (e.g. at least one of carbon ions or nitrogen ions). Optionally the ions of the chemical element may implanted through the cover layer 106. The cover layer 106 may include or be formed from at least one of the first portion 602a of the substrate 102; the second material, e.g. in form of an epitaxial layer. For example, the first processing region may include an ion source. For example, if the material of the substrate includes or is formed from silicon (for example, if the substrate 102 includes or is formed from silicon), the ions of the chemical element implanted may form a solid state compound, e.g. at least one of silicon nitride ($Si_xN_y$, e.g. $Si_3N_4$) or silicon carbide ($SiC_x$, e.g. SiC). In other words, the buried layer 104 may include or be formed from a solid state compound including or formed from at least one of $Si_3N_4$ or SiC.

According to various embodiments, for silicon nitride ($Si_xN_y$) the value x may be in the range from about 2 to about 4. Alternatively or additionally, for $Si_xN_y$ the value y may be in the range from about 3 to about 5.

According to various embodiments, for silicon carbide ($SiC_x$) the value x may be in the range from about 0.5 to about 2.

According to various embodiments, the ions of the chemical element may be configured to chemical react with a material of the substrate (e.g. a host material) to form a solid state compound which differs from a material of the substrate (e.g. the host material) in at least one of a chemical property, or a physical property. For example, a hardness of the solid state compound (solid-state compound) may be greater than a hardness of the substrate. Alternatively or additionally, an etchant resistance of the solid state compound may be greater than an etchant resistance of the substrate 102 (regadring an etchant used for thinning the substrate 102). For example, the substrate 102 may be irradiated 402 with other ions, different from carbon ions or nitrogen ions, e.g. if the substrate includes other material than silicon.

The penetration depth of the chemical element (e.g. at least one of carbon or nitrogen) may define a thickness 106d of the cover layer 106. The higher the implantation energy (may be understood as kinetic energy) of the ions of the chemical element, including at least one of carbon ions or nitrogen ions, the greater the penetration depth may be.

For example, the thickness 106d of the cover layer 106 may be substantially equal to the penetration depth. Illustratively, the penetration depth 104d may include a mean value and a spatial distribution around the mean value. The spatial distribution may define the thickness of the buried layer 104.

The thickness of the cover layer 106 may be in the range from about 50 nm to about 500 nm, e.g. in the range from about 100 nm to about 250 nm. The thickness of the buried layer 104 may be in the range from about 10 nm to about 100 nm, e.g. in the range from about 20 nm to about 50 nm.

Optionally, each method according to various embodiments may include in 400c tempering at least one of the substrate 102, the cover layer 106 or the buried layer 104, e.g. prior to thinning the substrate 102. According to various embodiments, tempering at least one of the substrate 102, the cover layer 106 or the buried layer 104, e.g. prior to thinning the substrate 102 may include or be formed from one or more tempering steps.

Tempering may include heating a region 406 including or formed from at least one of the cover layer 106 or the buried layer 104 over a transition temperature (of the respective layer). For example, tempering may include heating at least one of: the cover layer 106 (e.g. at least one of the first portion 602a of the substrate or the epitaxial layer 302) or the buried layer 104. For example, tempering may include heating the region 406 over a transition temperature of the region 406, e.g. a solid-liquid transition temperature or a glass transition temperature (illustratively, melting). For example, the region 406 which may be heated over its transition temperature may have a thickness 406d in the range from about 100 nm to about 800 nm, e.g. in the range from about 300 nm to about 500 nm, e.g. about 400 nm.

Tempering the substrate 102 may include using laser light 404 (e.g. provided by a laser source). For example, the first processing region may include a laser source. Heating the epitaxial layer 302 may provide at least one of improving the quality of the epitaxial layer 302 reducing defects of the epitaxial layer 302. Heating the first portion 602a of the substrate 102 may provide at least one of reducing defects of the first portion 602a of the substrate 102 (e.g. caused by the ion irradiation), or closing a filling the plurality of plurality of trenches 704 in the first portion 602a of the substrate 102. Heating the buried layer 104 may provide activating the buried layer 104. Each layer may be tempered by at least one tempering step of the one or more tempering steps.

The laser light 404 may be configured to have a penetration depth in the range from about 300 nm to about 500 nm, e.g. about 400 nm.

Figure 5A:
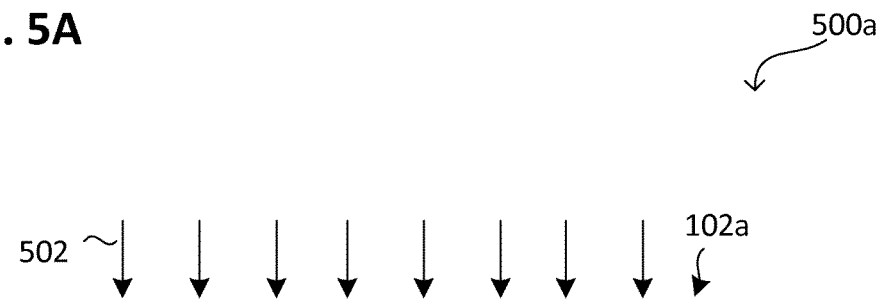
FIG. 5A to FIG. 5C respectively show a method according to various embodiments.
Figure 5B:
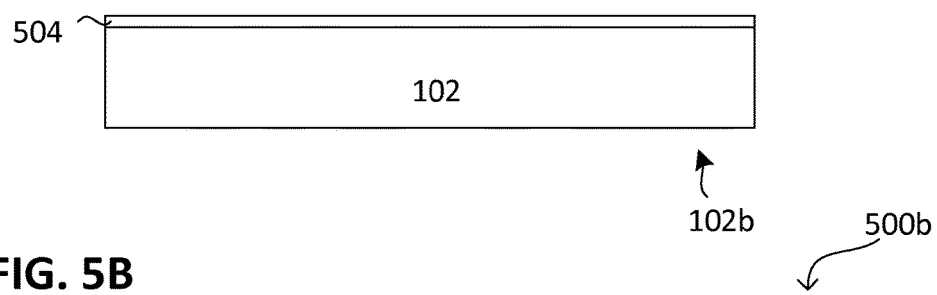

FIG. 5A and FIG. 5B respectively illustrate details to a method according to various embodiments.

According to various embodiments, forming a buried layer 104 may in 500a include forming a layer 504 over the substrate 102. Forming the layer 504 over the substrate 102 may include depositing 502 the first material over the substrate 102. The layer 504 (e.g. the first material respectively) may include or be formed from donor material of the chemical element, e.g. at least one of a carbon donor or a nitrogen donor. Alternatively or additionally, the layer 504 (e.g. the first material respectively) may include or be formed from a solid state compound including the semiconductor and the chemical element having a greater electronegativity than the semiconductor. The solid state compound may include or be formed from a semiconductor carbide/nitride, e.g. including the semiconductor, and at least one of nitrogen, or carbon), e.g. at least one of a carbide of the semiconductor (semiconductor carbide) or a nitride of the semiconductor (semiconductor nitride). For example, the first processing region may include a deposition source configured to deposit the first material.

Forming the layer 504 may include using at least one of a physical vapor deposition (PVD) or a chemical vapor deposition (CVD). Physical vapor deposition may include or be formed from at least one of: sputtering, electron beam evaporation, laser deposition, thermal evaporation. Optionally, physical vapor deposition may be assisted using a plasma source configured to form a plasma. Chemical vapor deposition may also include or be formed from atomic layer deposition. Optionally, chemical vapor deposition may be assisted using a plasma source configured to form a plasma (also referred as to plasma enhanced chemical vapor deposition).

According to various embodiments, the donor material may be tempered (e.g. using a tempering step similar to 400c) to transfer the chemical element (e.g. at least one of carbon or nitrogen) into the substrate 102. If the layer 504 includes a donor material (illustratively, a source for the chemical element, e.g. at least one of carbon or nitrogen) the remaining donor material (after transferring the chemical element, e.g. at least one of carbon or nitrogen, into the substrate 102) may be removed, e.g. after forming the buried layer 104.

According to various embodiments, forming a buried layer 104 may in 500b include forming a further layer 508 over the layer 504 to bury the layer 504. In other words, the buried layer 104 may be formed from the layer 504 by forming the further layer 508 over the layer 504.

Forming the further layer 508 over the layer 504 may include depositing 506 the second material over the layer 504. The further layer 508 (e.g. the second material respectively) may include or be formed from a semiconductor material, e.g. the material of the substrate 102. The further layer 508 may be formed epitaxial to form the epitaxial layer 302 (see FIG. 3A).

Forming the further layer 508 may include using at least one of a physical vapor deposition (PVD) or a chemical vapor deposition (CVD). In other words, the second process region may include at least one of a PVD source or a CVD source.

Figure 5C:
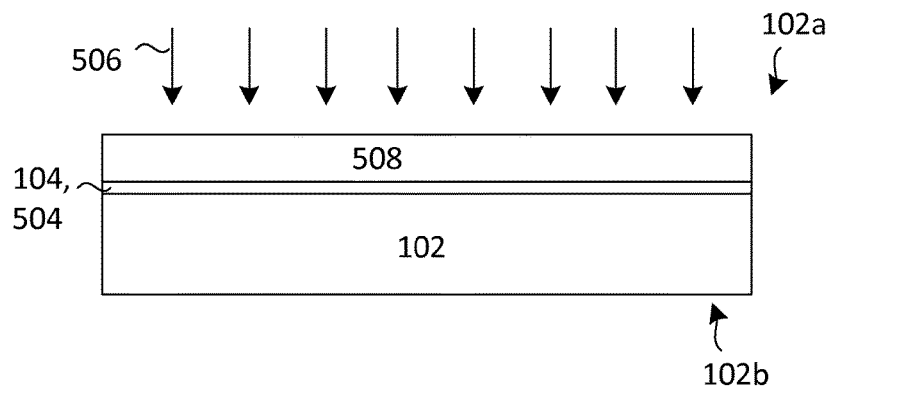

FIG. 5C illustrates details to a method according to various embodiments.

According to various embodiments, the buried layer 104 may be formed in the epitaxial layer 302, e.g. using ion implantation (see FIG. 4B). Optionally, the further layer 508 may be formed over the buried layer 104, e.g. over the epitaxial layer 302 including the buried layer 104. This may reduce or suppress a diffusion of atoms from the substrate 102 into the further layer 508, e.g. into at least one electrical circuit component 606 formed in the further layer 508 (see FIG. 6C). A distance of the buried layer 104 from an interface 556 between the substrate 102 and the epitaxial layer 302 may still lead to some atoms diffusing from the region between the buried layer 104 and the interface 556 into the further layer 508.

Figure 6A:
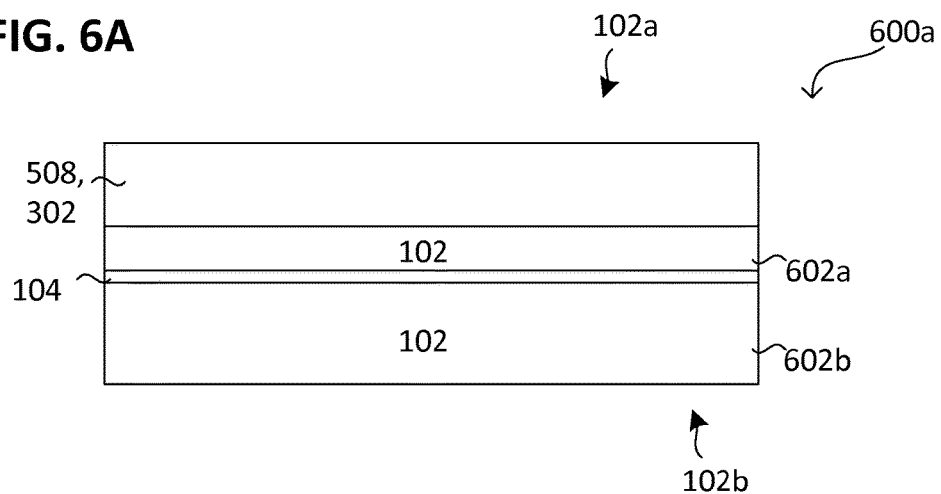
FIG. 6A to FIG. 6C respectively show a method according to various embodiments.
Figure 6B:
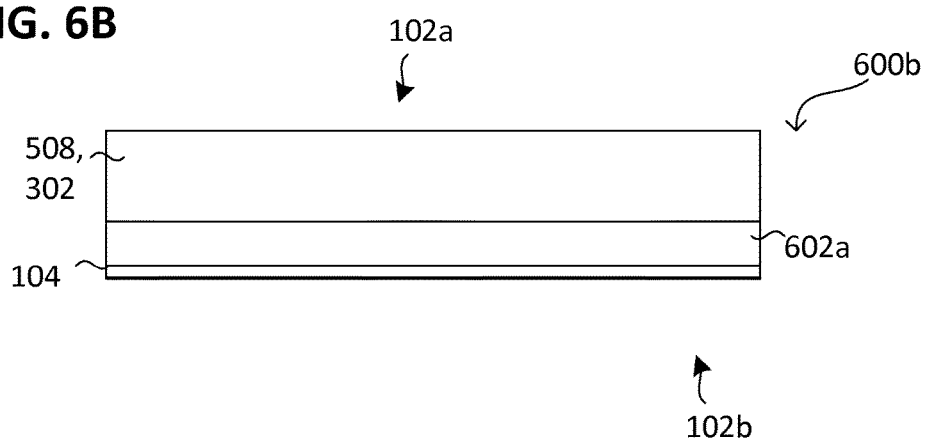
Figure 6C:
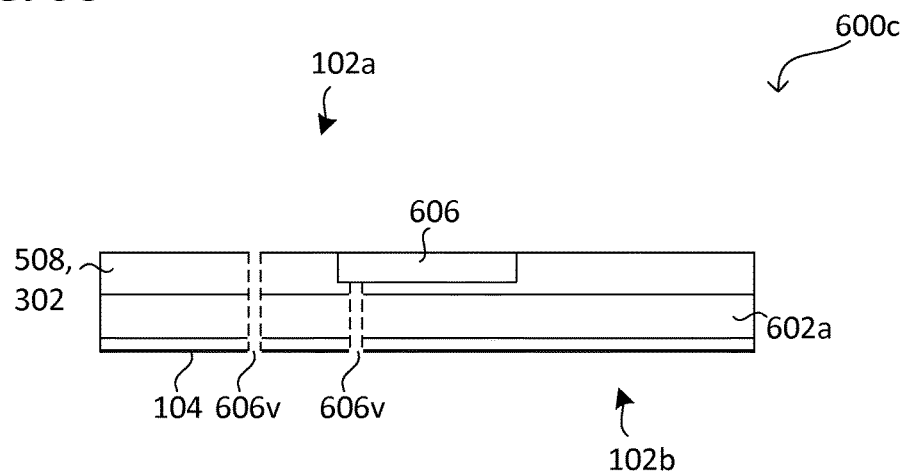

FIG. 6A, FIG. 6B and FIG. 6C respectively illustrate details to a method according to various embodiments.

According to various embodiments, forming the buried layer may in 600a include forming a layer arrangement. The layer arrangement may include or be formed from a substrate 102, an epitaxial layer over the substrate 102, and a buried layer 104 in the substrate 102 and between the substrate 102 and a further layer 508 (including or formed from the epitaxial layer 302). The substrate 102 may include a first portion 602a disposed between the further layer 508 and the buried layer 104 and a second portion 602b disposed opposite the first portion 602a (on the opposite side of the buried layer 104).

Thinning the substrate 102 may in 600b include removing the second portion 602b of the substrate 102. Thinning the substrate 102 may include exposing the buried layer 104 on the second side 102b at least partially.

Optionally, each method according to various embodiments may include in 600c forming at least one circuit component 606 (one or more circuit components 606) at least one of in or over the further layer 508. Forming the at least one circuit component 606 may include at least one of: doping a region of the further layer 508, metalizing the further layer 508, forming a layer over the further layer 508, forming a trench in the further layer 508.

Forming the at least one circuit component 606 may be prior removing the buried layer 104 at least partially or after removing the buried layer 104 at least partially. Forming the at least one circuit component 606 may include processing the further layer 508 on the first side 102a. A thickness of the further layer 508 (e.g. an epitaxial layer 508) may be in the range from about 1 micrometer (μm) to about 200 micrometer, e.g. in the range from about 5 micrometer to about 200 micrometer, e.g. for forming one or more electrical circuit elements in the further layer 508.

According to various embodiments, one or more circuit components 606 (electrical circuit components 606=(e.g. a power device) may be formed in the further layer 508. For example, the one or more circuit components 606 may include or be formed from at least one of one or more insulated-gate bipolar transistors (IGBT), one or more diodes, one or more Power-MOSFETs (metal-oxide semiconductor field-effect transistor), or one or more transistors. Optionally at least one of other electrical devices or one or more circuits may be formed in the further layer 508.

Optionally, each method according to various embodiments may include in 600c forming a conductive layer (not shown, see also FIG. 9C), e.g. a metallization, by processing the second side of the substrate 102, e.g. after removing the buried layer 104 at least partially.

Optionally, one or more vias 606v may be formed for one or more through contacts. The one or more vias 606v may extend through at least one of a remaining portion 602a of the substrate 102, the epitaxial layer 302, the buried layer, or the further layer 508. Alternatively or additionally, the one or more vias 606v may extend from the at least one circuit component 606 to the second side 102b opposite the at least one circuit component 606. In other words, the one or more electrical through contacts may enable a back contact.

The one or more vias 606v may be filled with an electrically conductive material, e.g. a metal, e.g. copper. The electrically conductive material may form one or more electrical through contacts. The electrically conductive material may provide an electrically contacting region on at least one of: the first side 102b, or the second side 102b. Alternatively or additionally, the electrically conductive material may electrically contact the at least one circuit component 606.

Figure 7A:
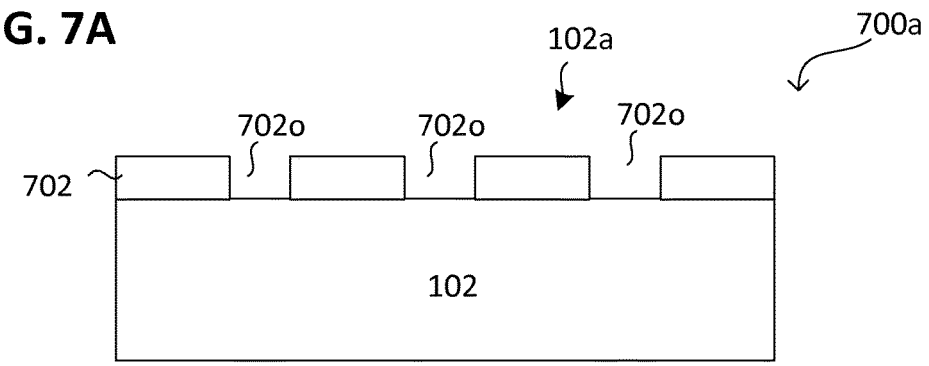
FIG. 7A to FIG. 7C respectively show a method according to various embodiments.
Figure 7B:
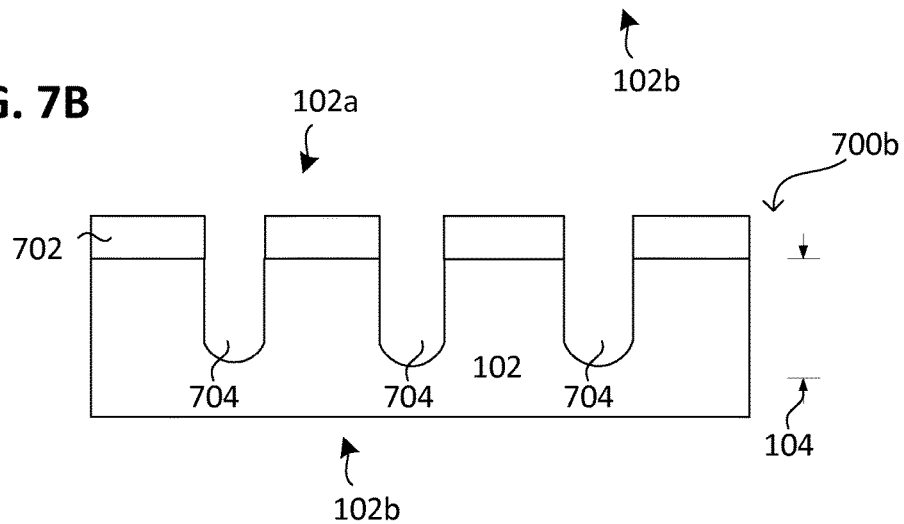
Figure 7C:
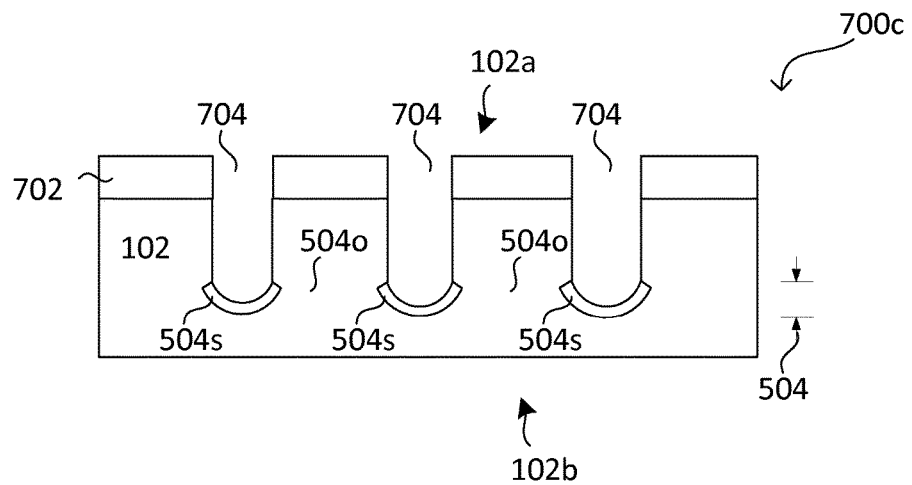

FIG. 7A, FIG. 7B and FIG. 7C respectively illustrate details to a method according to various embodiments.

Forming the buried layer 104 may in 700a include forming a mask structure over the substrate 102. The mask structure 702 may include a plurality of openings 702o exposing the substrate 102. The mask structure 702 may include or be formed from at least one of an organic material (e.g. resin, polymer) or inorganic material (e.g. silicon dioxide, silicon nitride).

Forming the buried layer 104 may in 700b include forming a plurality of trenches 704 in the substrate 102. Forming the plurality of trenches 704 may include using etching, e.g. at least one of dry etching or wet etching. The plurality of trenches 704 may extend from the regions of the substrate exposed by the openings 702 in into the substrate 102. A depth of the plurality of trenches 704 may be in the range from about 1 μm to about 10 μm, e.g. in the range from about 2 μm to about 6 μm. For example, the plurality of trenches 704 may be formed in the first portion 602a of the substrate 102 (proximate the first side 102a).

Forming the buried layer 104 may in 700c include forming a layer 504 in the substrate 102. Forming the layer 504 in the substrate 102 may include depositing 502 the first material in the plurality of trenches 704. The layer 504 (e.g. the first material respectively) may include or be formed from donor material of the chemical element, e.g. at least one of a carbon donor a nitrogen donor. Alternatively or additionally, the layer 504 (e.g. the first material respectively) may include or be formed from a solid state compound (e.g. including the semiconductor and the chemical element, e.g. at least one of nitrogen, or carbon), e.g. at least one of a carbide of the semiconductor or a nitride of the semiconductor. For example, the first processing region may include a deposition source, e.g. configured to provide the first material.

Alternatively or additionally, to depositing 502 the first material in the plurality of trenches 704, forming the buried layer 104 may in 700c include implanting ions of the chemical element, e.g. at least one of carbon ions or nitrogen ions, into the substrate 102, e.g. through the plurality of trenches 704. For example, the first processing region may include an ion source, e.g. configured to provide ions of the chemical element (e.g. at least one of carbon ions or nitrogen ions).

The layer 504 may include a plurality of segments 504s, each segment of the plurality of segments 504s may be disposed proximate to a bottom region of one trench of the plurality of trenches 704. For forming the layer 504, the mask structure 702 may be used as at least one of: implantation mask or lift-off mask. The implantation mask may define the regions in which ions of the chemical element irradiate the substrate 102. In other words, the openings 702o of the mask structure 702 may define the regions in which the substrate 102 may be irradiated by the ions of the chemical element. In other words, the openings 702o of the mask structure 702 may expose the substrate 102 to an irradiation with ions of the chemical element. The lift-off mask may define regions of the substrate 102 over which the first material may be deposited. In other words, the openings 702o of the lift-off structure 702 may expose the substrate 102 to a deposition of the first material. The regions around the openings 702o of the mask structure 702 may shield the (underlying regions of the) substrate 102 (e.g., the regions of the substrate 102 between the plurality of trenches 704) from being exposed to at least one of: a deposition with the first material, or an irradiation with ions of the chemical element.

The position and width of each trench of the plurality of trenches 704 may define the position and width of each segment 504s of the layer 504. The regions of the substrate 102 between the plurality of trenches may defined the position and width of the openings 504o of the layer 504.

Figure 8A:
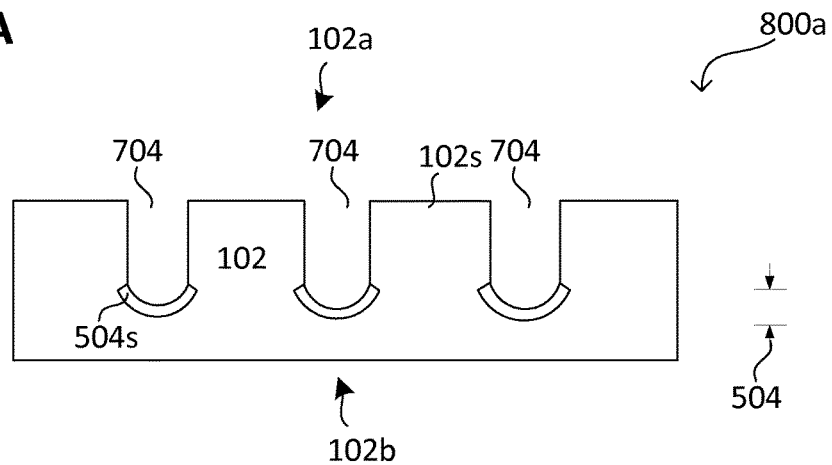
FIG. 8A to FIG. 8C respectively show a method according to various embodiments.
Figure 8B:
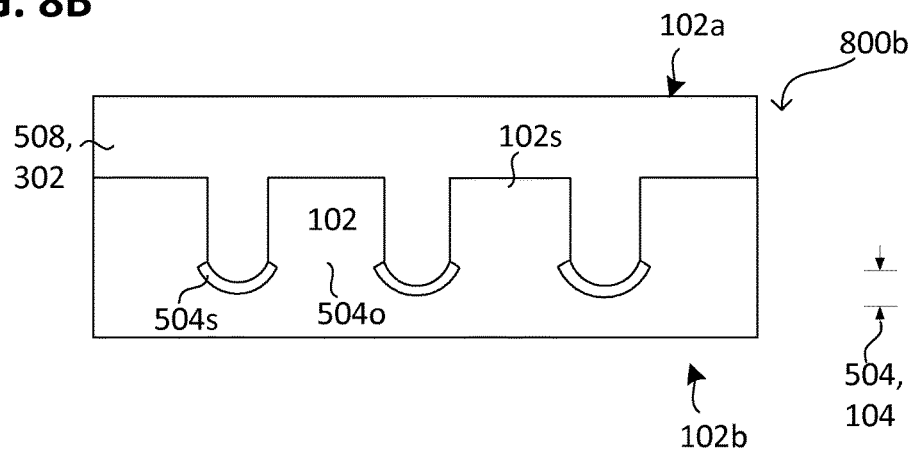
Figure 8C:
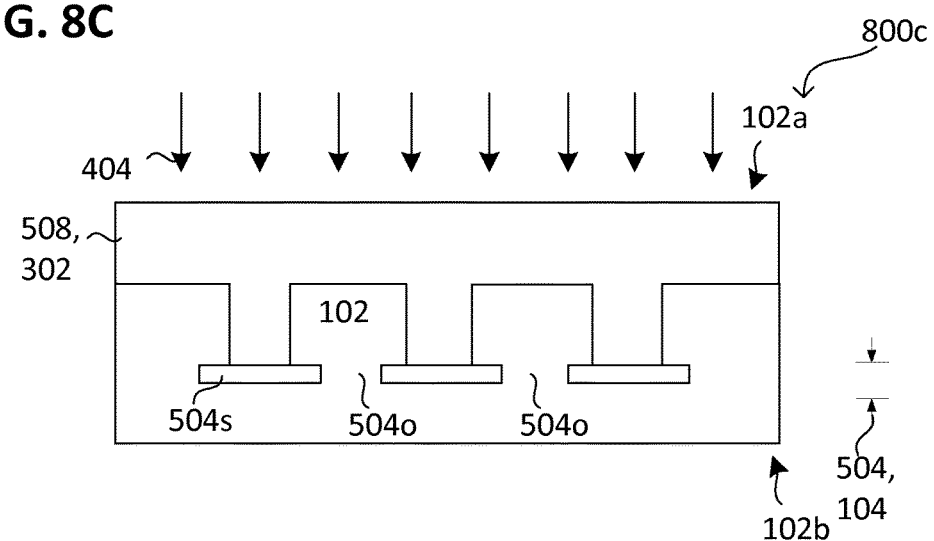

FIG. 8A, FIG. 8B and FIG. 8C respectively illustrate details to a method according to various embodiments.

Forming the buried layer 104 may in 800a include removing the mask structure 702 from the substrate 102. Removing the mask structure 702 from the substrate 102 may include exposing a surface 102s of the substrate 102 on the first side 102a.

Forming the buried layer 104 may in 800b include forming a further layer 508 (including or formed from the epitaxial layer 302) over the substrate 102 to bury the layer 504 (in other words, to form the buried layer 104 from the layer 504). Forming the further layer 508 may include filling the plurality of trenches 704 with material of the further layer 508, e.g. material of the substrate, e.g. epitaxial. The segments 504s and openings 504o of the layer 508 may be segments 504s and openings 504o of the buried layer 104. The further layer 508 may be formed in physical contact with the substrate 102, e.g. in physical contact with the surface 102s of the substrate 102 on the first side 102a.

According to various embodiments, the plurality of trenches 704 may be filled by at least one of lateral or vertical epitaxial (e.g. silicon) deposition, wherein the lateral epitaxial deposition (e.g. growth of silicon) may increase a crystalline quality of the material filling the plurality of trenches 704, e.g. in the upper portion of each trench of the plurality of trenches 704.

Alternatively, the filling the plurality of trenches 704 may include or be formed from heating the substrate 102, e.g. the first portion 602a of the substrate 102. In other words, the plurality of trenches 704 may be removed by heating the substrate 102, e.g. the first portion 602a of the substrate 102. Heating the substrate 102, e.g. the first portion 602a of the substrate 102 may include using laser light. The first portion 602a of the substrate 102 may be melted at least partially by heating the substrate 102. For example, by heating the substrate 102 in hydrogen-containing atmosphere, the plurality of trenches 704 may be partially filled by a (e.g. silicon) layer, e.g. in the upper portion of the plurality of trenches 704, wherein a cavity may remain between the (e.g. silicon) layer and a bottom of each trench of the plurality of trenches 704 (according to the so-called Venecia-process).

Optionally, tempering the substrate 102 may in 800c include heating the buried layer 104, e.g. such that a temperature of the buried layer 104 may remain under a transition temperature of at least one of: the buried layer 104 (in other words, the material of the buried layer 104) or the substrate (in other words, the material of the substrate). Heating the buried layer 104 may include reducing at least one of a size of the openings 504o of the buried layer 104 or a number of the openings 504o of the buried layer 104. Alternatively or additionally, heating the buried layer 104 may include forming a solid state compound including the material of the substrate 102 and the chemical element (e.g. at least one of carbon or nitrogen), e.g. a nitride of the material of the substrate 102 or a carbide of the material of the substrate 102. In other words, heating the buried layer 104 may include forming at least one of a nitride or a carbide in the buried layer 104.

For example, heating the buried layer 104 may include activating the buried layer 104, e.g. activate rearrangement of at least one of: positions of atoms of the buried layer 104 (for reducing at least one of a size of the openings 504o of the buried layer 104 or a number of the openings 504o of the buried layer 104) or chemical bonds of atoms of the buried layer 104 (for forming the solid state compound, e.g. at least one of a nitride or a carbide, in the buried layer 104). Activating the buried layer 104 may include activate a diffusion of atoms of the buried layer 104 for rearranging positions of the atoms of the buried layer 104. Alternatively or additionally, activating the buried layer 104 may include activate a diffusion of atoms of the buried layer 104 for homogenize a (chemical) composition of the buried layer 104.

The buried layer 104 may include, e.g. after homogenizing, a composition gradient, for example, including a first concentration of the chemical element (e.g. at least one of carbon or nitrogen) in the central region of the buried layer 104 (e.g. a central sublayer), and a second concentration of the chemical element (e.g. at least one of carbon) or nitrogen at the interfaces of the buried layer 104.

Tempering the substrate 102 may include using at least one of laser light 404 (e.g. provided by a laser source) or a suitable furnace. For example, the first processing region may include a laser source. Alternatively or additionally, tempering the substrate 102 may include using a heat source (configured to provide heat energy) and transferring 404 the heat energy to the substrate 102. For example, the first processing region may include a heat source.

Optionally, reducing at least one of a size of the openings 504o of the buried layer 104 or a number of the openings 504o of the buried layer 104 may include forming an continuous buried layer 104 (in other words, removing the openings 504o from the layer). In other words, the atoms of the buried layer 104 may diffuse in a lateral direction into the openings 504o in other words, by diffusion).

Figure 9A:
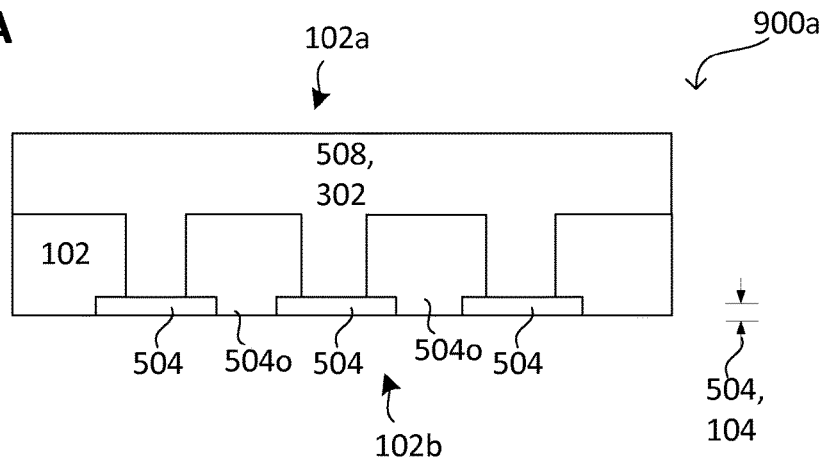
FIG. 9A to FIG. 9C respectively show a method according to various embodiments.
Figure 9B:
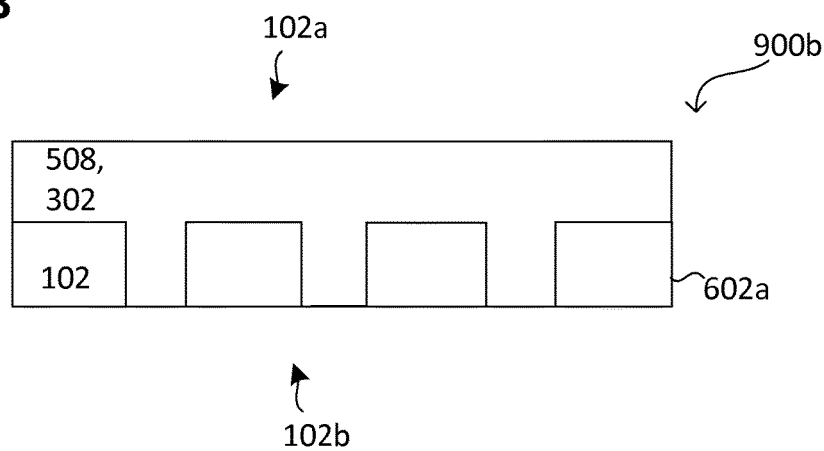
Figure 9C:
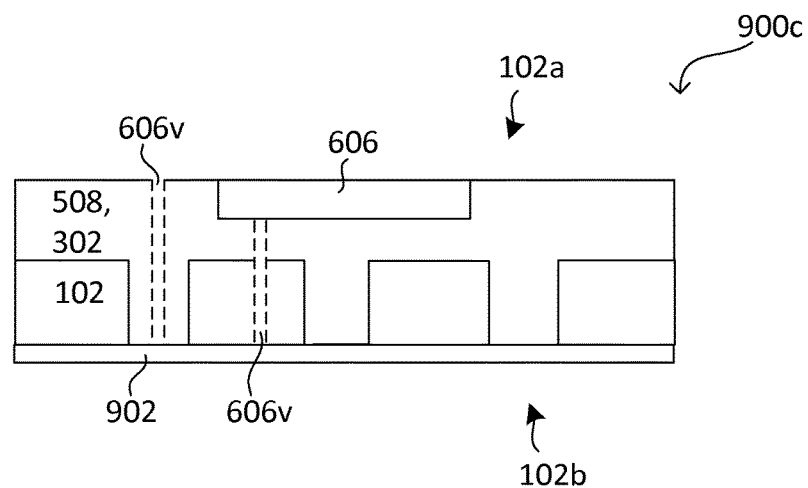

FIG. 9A, FIG. 9B and FIG. 9C respectively illustrate details to a method according to various embodiments.

Thinning the substrate 102 may in 900a include exposing the buried layer 104 at least partially (e.g. by removing the second portion 602b of the substrate 102). If the buried layer 104 includes the openings 504o, thinning the substrate 102 may also include exposing a portion of the substrate 102 disposed in the openings 504o of the buried layer 104.

Removing the buried layer 104 at least partially may in 900b include exposing at least one of: the first portion 602a of the substrate 102 or the further layer 508.

Optionally, forming at least one circuit component 606 (one or more circuit components 606) may include in 900c forming a conductive layer 902 (e.g. including or formed from a metallization) by processing the second side 102b of the substrate 102, e.g. after removing the buried layer 104 at least partially. The electrically conductive layer 902 may substantially cover an exposed surface of at least one of: the first portion 602a of the substrate 102 on the second side 102b or the further layer 508. The electrically conductive layer 902 may be coupled electrically to the at least one circuit component 606, e.g. electrically connected.

Optionally, one or more vias 606v may be formed for one or more electrical through contacts. The one or more vias 606v may extend through at least one of the substrate 102, the layer arrangement, the epitaxial layer 302, or the further layer 508. Alternatively or additionally, the one or more vias 606v may extend from the at least one circuit component 606 to a side opposite the at least one circuit component 606. The one or more vias 606v may be filled with an electrically conductive material, e.g. a metal, e.g. copper. The electrically conductive material may form one or more electrical through contacts. The electrically conductive material may electrically contact at least one of: the at least one circuit component 606, or the electrically conductive layer 902. Optionally, the electrically conductive layer 902 may be structured to form one or more contact pads.

Figure 10A:
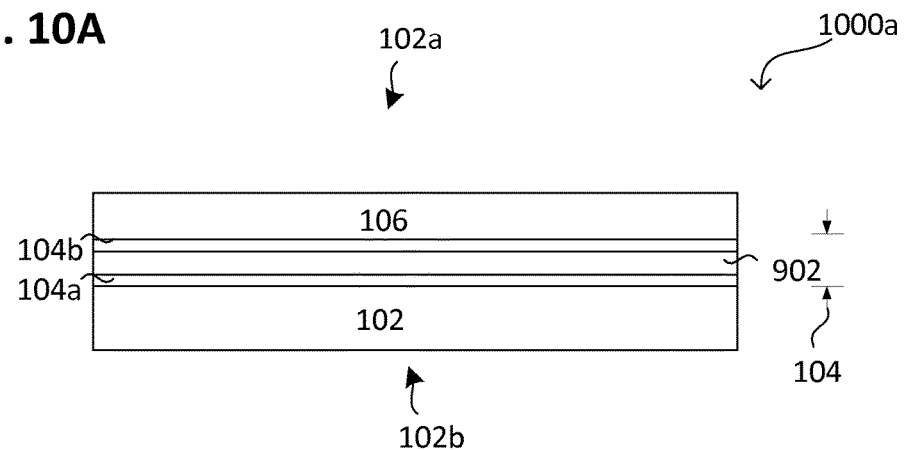
FIG. 10A to FIG. 10C respectively show a method according to various embodiments.
Figure 10B:
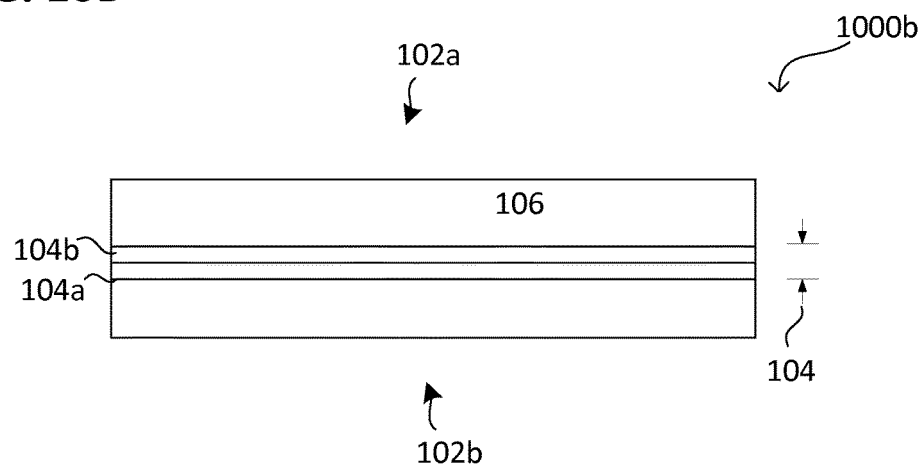
Figure 10C:
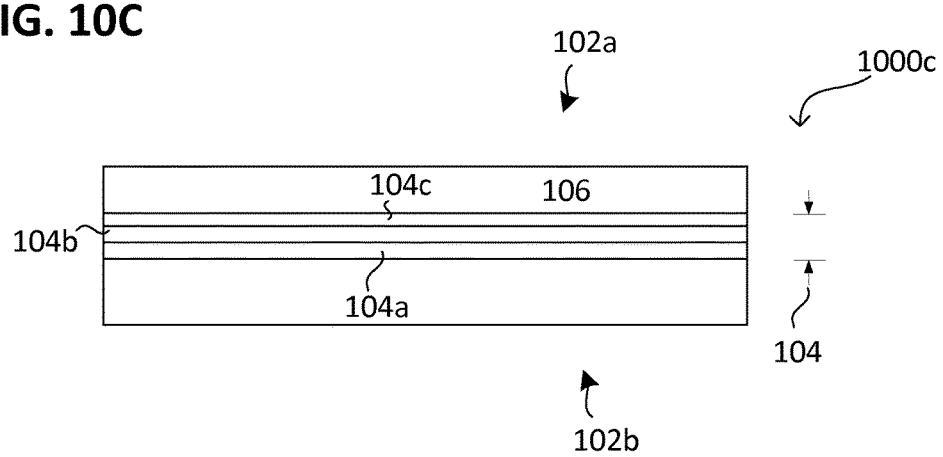

FIG. 10A, FIG. 10B and FIG. 10C respectively illustrate details to a method according to various embodiments.

Forming the buried layer 104 may include in 1000a forming at least two sublayers 104a, 104b of the buried layer 104. The at least two sublayers 104a, 104b (including a first sublayer 104a and a second sublayer 104b) may be distant to each other.

For example, the method may include forming a first sublayer 104a of the buried layer 104 over the substrate 102 by depositing the first material; forming an intermediate layer 902 over the first sublayer 104a of the buried layer 104, e.g. by depositing the second material; forming a second sublayer 104b of the buried layer 104 over the intermediate layer 902 by depositing a third material; and covering the second sublayer 104b of the buried layer 104 (e.g. by forming a cover layer 106). In other words, the intermediate layer 902 may be disposed between the first sublayer 104a of the buried layer 104 and the second sublayer 104b of the buried layer 104. Covering the second sublayer 104b of the buried layer 104 may include or be formed from forming the further layer 508 (including or formed from the epitaxial layer 302) over the second sublayer 104b of the buried layer 104. In other words, the covering the second sublayer 104b of the buried layer 104 may include forming the cover layer 106 over the second sublayer 104b of the buried layer 104. The third material may include or be formed from p-dopant donor material or a semiconductor material including the p-dopant, e.g. a p-doped semiconductor.

Alternatively, the method may include forming a first sublayer 104a of the buried layer 104 in the substrate by implanting first ions into the substrate 102; and forming a second sublayer 104b of the buried layer 104 over the first sublayer 104a of the buried layer 104 and in the substrate 102 by implanting second ions into the substrate 102. The second ions may include or be formed from a p-dopant ions. The first ions may include or be formed from ions of the chemical element (e.g. at least one of carbon ions or nitrogen ions). Implanting the first ions into the substrate 102 may include using a first implantation energy (kinetic energy of the first ions) and implanting second ions into the substrate 102 may include using a second implantation energy (kinetic energy of the second ions), wherein the first implantation energy is smaller than the second implantation energy. The difference of the first implantation energy and the second implantation energy may be configured to form the intermediate layer 902 between the first sublayer 104a of the buried layer 104 and the second sublayer 104b of the buried layer 104.

The second sublayer 104b (also referred as to p-doped sublayer) of the buried layer 104 may include impurity atoms (dopants) from a group different (e.g. lower) than the semiconductor of the substrate 102 (or at least one atom of the semiconductor of the substrate 102). The impurity atoms may replace atoms of the semiconductor of the substrate 102 which are from a higher group than the impurity atoms. For example, the impurity atoms may be group III atoms like boron if the substrate 102 includes or is formed from a group IV semiconductor.

The first sublayer 104a of the buried layer 104 may include the chemical element (e.g. at least one of carbon or nitride). For example, the first sublayer 104a of the buried layer 104 may include or be formed from the solid state compound, e.g. semiconductor carbide or semiconductor nitride.

In an alternative embodiment the positions of the first sublayer 104a of the buried layer 104 and the second sublayer 104b of the buried layer 104 may be interchanged.

In an alternative embodiment, forming the buried layer 104 may include in 1000b forming at least two sublayers 104a, 104b of the buried layer 104, wherein the at least two sublayers 104a, 104b (including a first sublayer 104a and a second sublayer 104b) may be in physical contact with each other. Forming the first sublayer 104a of the buried layer 104 and the second sublayer 104b of the buried layer 104 may be configured as in 1000a, wherein the intermediate layer 902 is left out.

According to various embodiments, forming the buried layer 104 may include in 1000c forming at least three sublayers 104a, 104b, 104c of the buried layer 104 (e.g. including a first sublayer 104a, a second sublayer 104b and a third sublayer 104c). The second sublayer 104b of the buried layer 104 may be disposed between the first sublayer 104a of the buried layer 104 and the third sublayer 104c of the buried layer 104. Forming the first sublayer 104a of the buried layer 104 and the second sublayer 104b of the buried layer 104 may be configured similar to 1000a or to 1000b. Forming the third sublayer 104c of the buried layer 104 may include disposing the first material between the substrate 102 and the second sublayer 104b of the buried layer 104 or implanting the first ions into the substrate 102, similar as described for the first sublayer 104a of the buried layer 104.

For example, the first sublayer 104a of the buried layer 104 and the third sublayer 104c of the buried layer 104, e.g. both including the chemical element (e.g. at least one of carbon or nitrogen, e.g. both including at least one of a carbide or a nitride), may be formed prior the second sublayer 104b of the buried layer 104. The first sublayer 104a of the buried layer 104 and the third sublayer 104b of the buried layer 104 may be formed having the intermediate layer 902 in between them (similar to 1000a). The second sublayer 104b of the buried layer 104 may be formed by implanting the second ions into the intermediate layer 902. The second implantation energy may be configured to form the second sublayer 104b of the buried layer 104 between the first sublayer 104a of the buried layer 104 and the third sublayer 104b of the buried layer 104.

In an alternative embodiment at least one of the positions of the first sublayer 104a of the buried layer 104 and the second sublayer 104b of the buried layer 104 may be interchanged; the positions of the first sublayer 104a of the buried layer 104 and third sublayer 104c of the buried layer 104 may be interchanged; the positions of the second sublayer 104b of the buried layer 104 and third sublayer 104c of the buried layer 104 may be interchanged.

The thickness of at least one of the intermediate layer 902, the first sublayer 104a of the buried layer 104, the second sublayer 104b of the buried layer 104, or the third sublayer 104c of the buried layer 104 may be in the range from about 5 nm to about 100 nm, e.g. in the range from about 5 nm to about 50 nm, e.g. in the range from about 5 nm to about 20 nm.

Figure 11A:
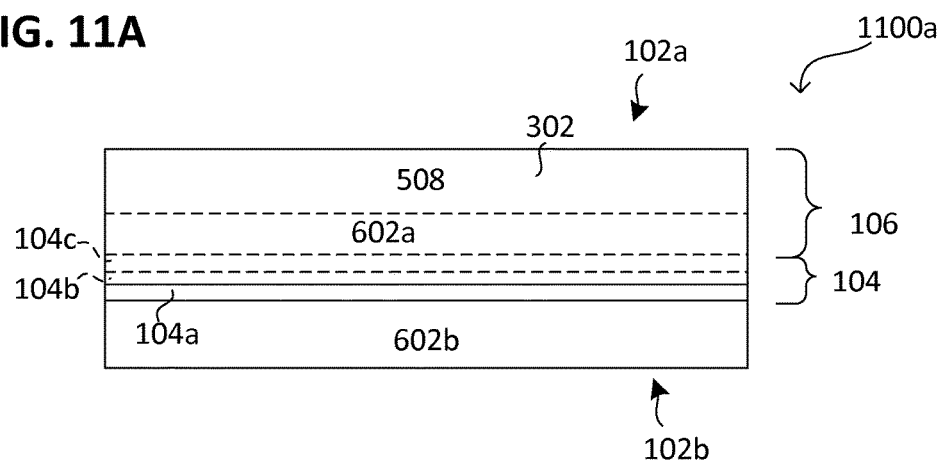
FIG. 11A to FIG. 11C respectively show a method according to various embodiments.
Figure 11B:
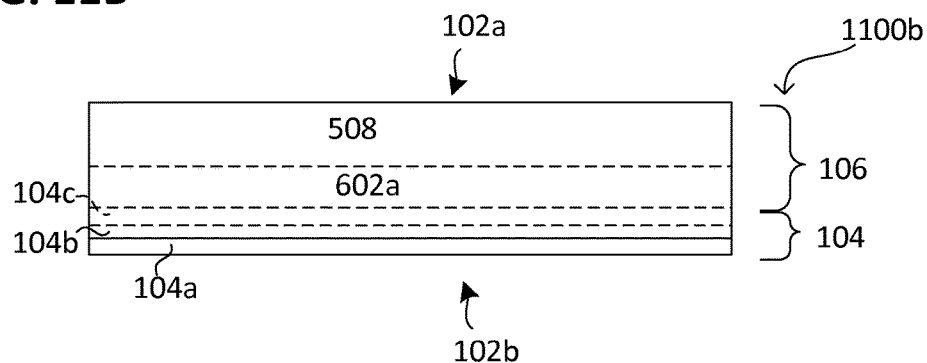
Figure 11C:
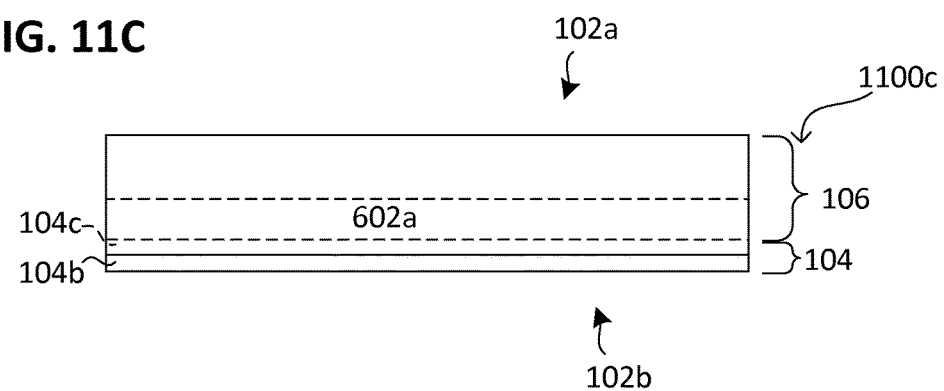

FIG. 11A, FIG. 11B and FIG. 11C respectively illustrate details to a method according to various embodiments.

Forming the buried layer 104 may include in 1100a forming the cover layer 106 (including or formed from the epitaxial layer 302) on the first side 102a. The cover layer 106 may include or be formed from the further layer 508. Optionally, the cover layer 106 may include the first portion 602a of the substrate 102. The buried layer 104 may include or be formed from at least the first sublayer 104a of the buried layer 104. Optionally, the buried layer 104 may include the second sublayer 104b of the buried layer 104. Optionally, the buried layer 104 may include the third sublayer 104c of the buried layer 104.

Thinning the substrate 102 may in 1100b include exposing the first sublayer 104a of the buried layer 104.

At least one of the first sublayer 104a of the buried layer 104 and the second sublayer 104b of the buried layer 104 may include or be formed from the solid state compound (e.g. a carbide/nitride compound) including a semiconductor and the chemical element (e.g. at least one of carbon or nitrogen), e.g. including or formed from at least one of a semiconductor nitride or a semiconductor carbide. The second sublayer 104b of the buried layer 104 may include or be formed from a p-doped semiconductor including the p-dopant (e.g. boron), e.g. including or formed from at least one of the semiconductor material and the p-dopant.

Removing the buried layer 104 at least partially may include in 1100c removing the first sublayer 104a of the buried layer 104. In the case, the buried layer 104 includes the second sublayer 104b of the buried layer 104, removing the buried layer 104 at least partially may include exposing the second sublayer 104b of the buried layer 104. In other words, removing the buried layer 104 partially may stop at the second sublayer 104b of the buried layer 104. Removing the first sublayer 104a of the buried layer 104 may include etching the buried layer 104. Removing the first sublayer 104a of the buried layer 104 may include using an etchant configured to etch the material of the first sublayer 104a of the buried layer 104 (e.g. the solid state compound) faster than material of the second sublayer 104b of the buried layer 104 (e.g. the p-doped semiconductor).

Removing the first sublayer 104a of the buried layer 104 and thinning the substrate 104 may include using the same process, e.g. the same etchant. Thinning the substrate 102 and removing the buried layer 104 partially from the second side 102b of the substrate 102 (e.g. using the second process) may include using an etchant configured to etch the material of the first sublayer 104a of the buried layer 104 (e.g. the solid state compound) and the material of the substrate 102 (e.g. the semiconductor of the substrate) faster than the material of the second sublayer 104b of the buried layer 104 (e.g. the p-doped semiconductor).

Optionally, the method may include forming an electrically conductive layer (see for example, FIG. 9C) on the second side over the second sublayer 104b of the buried layer 104.

If the buried layer 104 includes the third sublayer 104c of the buried layer 104, the third sublayer 104c of the buried layer 104 may remain between the second sublayer 104b of the buried layer 104 and the cover layer 106, e.g. between the second sublayer 104b of the buried layer 104 and the further layer 508, e.g. between the second sublayer 104b of the buried layer 104 and the second portion 602b of the substrate 102.

The second sublayer 104b of the buried layer 104 may include or be formed from a p-doped sublayer (p-doped semiconductor sublayer). According to various embodiments, the second sublayer 104b may include or be formed from a highly p-doped sublayer.

Further, various embodiments will be described in the following.

According to various embodiments, the buried layer may include at least one of carbon, nitrogen, or a solid state compound having a greater (at least one of physical or chemical) resistance to the thinning than the substrate.

According to various embodiments, an electronegativity of the buried layer may be greater than an electronegativity of the substrate (e.g. the buried layer may include an atom having a higher electronegativity than an atom of the substrate).

According to various embodiments, an electronegativity of a region or material (e.g. of the chemical element, of the substrate 102, of the buried layer 104) may be understood as a chemical property that describes the tendency of an atom of the region or the material to attract electrons (or electron density) towards itself The electronegativity is affected by both its atomic number (of a region or material) and the distance at which its valence electrons reside from the charged nucleus. The higher the associated electronegativity of the region or material, the more an chemical element or a compound of the region or material attracts electrons towards it.

According to various embodiments, a method may include: disposing a substrate with a first side of the substrate directed to a first process region; forming a buried layer using a first process provided by the first process region, wherein the first process is configured to transfer the chemical element (e.g. at least one of carbon or nitrogen) at least one of into or over the substrate; disposing the substrate with a second side of the substrate directed to a second process region, wherein the second side is opposite the first side; thinning the substrate using a second process provided by the second process region, wherein the second process is configured to stop at the buried layer.

According to various embodiments, a method may include: forming a layer including the chemical element (e.g. at least one of carbon or nitrogen) at least one of in or on a substrate; forming an epitaxial layer over the layer; wherein a first distance of the layer to a first side of the substrate is substantially smaller than a second distance of the layer to a second side of the substrate opposite the first side (in other words, the layer may be proximate the first side), thinning the substrate by etching the second side using the layer as etch stop.

According to various embodiments, a method may include: providing a substrate having a first side and a second side opposite the first side; forming a buried layer at least one of in or over the substrate by processing the first side of the substrate; thinning the substrate from the second side of the substrate, wherein the thinning stops at the buried layer.

According to various embodiments, the buried layer may include or be formed from a solid state compound having a greater (at least one of physical or chemical, e.g. at least one of etching or mechanical) resistance to the thinning than the substrate.

According to various embodiments, an electronegativity of the solid state compound may be greater than an electronegativity of the substrate (e.g. the solid state compound may include an atom having a higher electronegativity than an atom of the substrate).

According to various embodiments, a method may include: providing a substrate having a first side and a second side opposite the first side; forming a buried layer at least one of in or over the substrate by processing the first side of the substrate, wherein the buried layer includes the chemical element (e.g. at least one of carbon, nitrogen), or a solid state compound (e.g. including a material of the substrate and the chemical element) having at least one of a hardness greater than a hardness of the substrate or an etchant resistance greater than an etchant resistance of the substrate; thinning the substrate from the second side of the substrate, wherein the thinning stops at the buried layer.

According to various embodiments, a method may include: providing a substrate having a first side and a second side opposite the first side; forming a buried layer at least one of in or over the substrate by processing the first side of the substrate; thinning the substrate from the second side of the substrate, wherein the buried layer includes or is formed from a solid state compound having a greater resistance to the thinning than the substrate and the thinning stops at the buried layer.

According to various embodiments, a greater chemical resistance (e.g. an etchant resistance) may be provided by a smaller chemical reactivity (e.g. to the chemical etching used for thinning) .

According to various embodiments, a method may include: providing a substrate having a first side and a second side opposite the first side; forming a buried layer at least one of in or over the substrate by processing the first side of the substrate, thinning the substrate from the second side of the substrate, wherein the thinning stops at the buried layer; wherein the buried layer includes the chemical element (e.g. at least one of carbon, or nitrogen), or a solid state compound (e.g. including a material of the substrate and the chemical element, e.g. or at least one of carbon or nitrogen) having a greater (at least one of physical or chemical) resistance to the thinning than the substrate.

According to various embodiments, the buried layer (e.g. the solid state compound) may include or be formed from at least one of a carbide (e.g. of a material of the substrate) or a nitride (e.g. of the material of the substrate).

According to various embodiments, the method may further include: forming an epitaxial layer over the substrate, wherein the buried layer is formed at least one of in the substrate, in the epitaxial layer, or between the substrate and the epitaxial layer.

According to various embodiments, the epitaxial layer may include or be formed from the material of the substrate.

According to various embodiments, forming the buried layer in the substrate may include or be formed from implanting a chemical element (e.g. at least one of carbon or nitrogen) having a greater electronegativity than the substrate, e.g. into at least one of the substrate or the epitaxial layer.

According to various embodiments, the method may further include forming at least one of the following circuit components at least one of in the epitaxial layer or over the buried layer: an insulated-gate bipolar transistor, a diode, a transistor, a metal-oxide semiconductor field-effect transistor, a power metal-oxide semiconductor field-effect transistor, a circuit structure.

According to various embodiments, the method may further include forming a power circuit components at least one of in the epitaxial layer or over the buried layer.

According to various embodiments, the method may further include forming an electrical connection from the at least one circuit component to a side opposite the at least one circuit component.

According to various embodiments, the method may further include forming an electrical through contact in at least one of the substrate or the epitaxial layer, the electrical through contact electrically contacting the at least one circuit component.

According to various embodiments, forming the buried layer in the substrate may include: forming a plurality of trenches into the substrate; at least one of implanting or disposing a chemical element (e.g. at least one of carbon or nitrogen) having a higher electronegativity than the substrate through the plurality of trenches into the substrate; and filling (e.g., closing) the plurality of trenches.

According to various embodiments, thinning the substrate may include or be formed from etching (e.g. anisotropic etching).

According to various embodiments, filling the plurality of trenches may include or be formed from melting the substrate partially by heating at least the first side of the substrate.

According to various embodiments, the method may further include contacting the second side of the substrate.

According to various embodiments, the method may further include forming an electrical conductive layer over the substrate by processing the second side of the substrate (in other words, forming an electrical conductive layer over the second side of the substrate) for contacting the substrate.

According to various embodiments, heating at least the first side of the substrate may include or be formed from using a laser.

According to various embodiments, filling the plurality of trenches may include or be formed from forming the epitaxial layer over the substrate.

According to various embodiments, the method may further include: tempering the substrate to homogenize a composition of the buried layer.

According to various embodiments, homogenize the composition of the buried layer may include at least one of: diffusing material of the buried layer into the substrate (e.g. in a lateral direction); forming the solid state compound, e.g. at least one of carbide or nitride, in the buried layer.

According to various embodiments, forming the buried layer may include forming a p-doped sublayer of the buried layer.

According to various embodiments, the p-doped sublayer layer may include or be formed from a group III material, e.g. boron.

According to various embodiments, the method may further include: removing the buried layer at least partially after the thinning According to various embodiments, removing the buried layer at least partially may include or be formed from exposing at least one of: a portion of the substrate, a p-doped sublayer of the buried layer, an epitaxial layer over the substrate.

According to various embodiments, the buried layer includes or is formed from at least two sublayers differing from each other in at least a chemical composition.

According to various embodiments, thinning the substrate may include or be formed from at least one of: grinding, chemical-mechanical polishing, wet etching, electrochemical etching, dry etching, ion etching (e.g. reactive ion etching).

According to various embodiments, thinning the substrate may include or be formed from using an etchant to which the buried layer is inert.

According to various embodiments, thinning the substrate may include or be formed from selective etching. In other words, an etchant may be used which is configured for selective etching. Selective etching may be configured to etch one material (e.g. of the substrate) faster than another material (e.g. of the buried layer).

According to various embodiments, thinning the substrate may include or be formed from using an etchant which is configured to etch the substrate faster than the buried layer.

According to various embodiments, the method may further include forming one or more electrical circuit components at least one of in or over the epitaxial layer.

According to various embodiments, the buried layer may be proximate at least the first side of the substrate.

According to various embodiments, a method may include: forming a buried layer at least one of in or over a substrate; thinning the substrate, wherein the thinning stops at the buried layer; and removing the buried layer at least partially after the thinning According to various embodiments, a method may include: forming a buried layer at least one of in or over a substrate; wherein the buried layer includes the chemical element (e.g. at least one of carbon, or nitrogen) or a solid state compound (e.g. including a material of the substrate and the chemical element) having a greater hardness than the substrate or an greater etchant resistance than the substrate; thinning the substrate, wherein the thinning stops at the buried layer; and removing the buried layer at least partially after the thinning According to various embodiments, a greater chemical resistance (e.g. an etchant resistance) may be provided by a smaller chemical reactivity (e.g. to the chemical etching used for thinning).

According to various embodiments, a method may include: forming a buried layer at least one of in or over a substrate; thinning the substrate, wherein the thinning stops at the buried layer; and removing the buried layer at least partially after the thinning; wherein the buried layer includes the chemical element (e.g. at least one of carbon, or nitrogen), or a solid state compound (e.g. including a material of the substrate and the chemical element) having a greater (at least one of physical or chemical) resistance to the thinning than the substrate.

According to various embodiments, the buried layer may include or be formed from the solid state compound, e.g. at least one of a carbide (e.g. of a material of the substrate) or a nitride (e.g. of the material of the substrate).

According to various embodiments, the solid state compound may include or be formed from at least one of carbon, or nitrogen.

According to various embodiments, the method may further include: forming an epitaxial layer over the substrate, wherein the buried layer is formed at least one of in the substrate, in the epitaxial layer, or between the substrate and the epitaxial layer.

According to various embodiments, the epitaxial layer may include or be formed from the material of the substrate.

According to various embodiments, forming the buried layer in the substrate may include or be formed from implanting a chemical element having a greater electronegativity than the substrate (e.g. at least one of carbon or nitrogen), e.g. into the substrate.

According to various embodiments, forming the buried layer in the substrate may include: forming a plurality of trenches into the substrate; at least one of implanting or disposing a chemical element (e.g. at least one of carbon or nitrogen) having a higher electronegativity than the substrate through the plurality of trenches into the substrate; filling the plurality of trenches.

According to various embodiments, thinning the substrate may include or be formed from etching (e.g. anisotropic etching).

According to various embodiments, filling the plurality of trenches may include or be formed from melting the substrate partially by heating at least the first side of the substrate.

According to various embodiments, heating at least the first side of the substrate may include or be formed from using a laser.

According to various embodiments, the method may further include contacting the second side of the substrate.

According to various embodiments, the method may further include forming an electrical conductive layer over the substrate by processing the second side of the substrate (in other words, forming an electrical conductive layer over the second side of the substrate) for contacting the substrate.

According to various embodiments, filling the plurality of trenches may include or be formed from forming the epitaxial layer over the substrate.

According to various embodiments, the method may further include: tempering the substrate to homogenize a composition of the buried layer.

According to various embodiments, homogenize the composition of the buried layer may include at least one of: diffusing material of the buried layer into the substrate (e.g. in a lateral direction); forming the solid state compound, e.g. at least one of carbide or nitride, in the buried layer.

According to various embodiments, forming the buried layer may include or be formed from forming a p-doped sublayer of the buried layer.

According to various embodiments, the buried layer includes or is formed from at least two sublayers differing from each other in at least a chemical composition.

According to various embodiments, the buried layer may include or be formed from at least two sublayers which at least one of differ from each other in at least a chemical composition or are distant from each other.

According to various embodiments, the p-doped sublayer layer may include or be formed from a group III material, e.g. boron.

According to various embodiments, removing the buried layer at least partially may include or be formed from exposing at least one of: a portion of the substrate, a p-doped sublayer of the buried layer, an epitaxial layer over the substrate.

According to various embodiments, thinning the substrate may include or be formed from at least one of: grinding, chemical-mechanical polishing, wet etching, electrochemical etching, dry etching, ion etching (e.g. reactive ion etching).

According to various embodiments, thinning the substrate may include or be formed from using an etchant to which the buried layer is inert.

According to various embodiments, thinning the substrate may include or be formed from using an etchant which is configured to etch the substrate faster than the buried layer.

According to various embodiments, thinning the substrate may include or be formed from selective etching. In other words, an etchant may be used which is configured for selective etching. Selective etching may be configured to etch one material (e.g. of the substrate) faster than another material (e.g. of the buried layer).

According to various embodiments, thinning the substrate may include using an etchant, which etches the substrate faster than the buried layer. In other words, an etchant resistance of the buried layer regarding the etchant may be greater than an etchant resistance of the substrate regarding the etchant.

According to various embodiments, a greater chemical resistance (e.g. an etchant resistance) may be provided by a smaller chemical reactivity (e.g. to the chemical etching used for thinning).

According to various embodiments, the method may further include contacting the second side of the substrate.

According to various embodiments, the method may further include forming an electrical conductive layer over the substrate by processing the second side of the substrate (in other words, forming an electrical conductive layer over the second side of the substrate) for contacting the substrate.

According to various embodiments, the method may further include forming one or more electrical circuit components at least one of in or over the epitaxial layer.

According to various embodiments, the buried layer may be proximate the first side of the substrate. According to various embodiments, a method may include: forming a layer arrangement, including or formed from a substrate, an epitaxial layer over the substrate, and a buried layer at least one of in the substrate, in the epitaxial layer, or between the substrate and the epitaxial layer, wherein the buried layer is proximate a first side of the substrate facing the epitaxial layer; thinning the substrate from a second side of the substrate opposite the first side of the substrate, wherein the thinning stops at the buried layer.

According to various embodiments, a method may include: forming a layer arrangement, including or formed from a substrate, an epitaxial layer over the substrate, and a buried layer at least one of in the substrate, in the epitaxial layer, or between the substrate and the epitaxial layer, the buried layer including the chemical element (e.g. at least one of carbon or nitrogen) or a solid state compound (e.g. including a material of the substrate and the chemical element) having at least one of a greater hardness than the substrate or a greater etchant resistance than the substrate, wherein the buried layer is proximate a first side of the substrate facing the epitaxial layer; thinning the substrate from a second side of the substrate opposite the first side of the substrate, wherein the thinning stops at the buried layer.

According to various embodiments, a greater chemical resistance (e.g. an etchant resistance) may be provided by a smaller chemical reactivity (e.g. to the chemical etching used for thinning).

According to various embodiments, a method may include: forming a layer arrangement, including or formed from a substrate, an epitaxial layer over the substrate, and a buried layer at least one of in the substrate, in the epitaxial layer, or between the substrate and the epitaxial layer, wherein the buried layer is proximate a first side of the substrate facing the epitaxial layer; thinning the substrate from a second side of the substrate opposite the first side of the substrate, wherein the thinning stops at the buried layer, wherein the buried layer includes the chemical element (e.g. at least one of carbon, or nitrogen), or a solid state compound (e.g. including a material of the substrate and the chemical element) having a greater (at least one of physical or chemical) resistance to the thinning than the substrate.

According to various embodiments, a greater physical resistance (e.g. a mechanical resistance) may be provided by a greater mechanical hardness.

According to various embodiments, a greater chemical resistance (e.g. an etchant resistance) may be provided by a smaller chemical reactivity (e.g. to the chemical etching used for thinning).

According to various embodiments, a greater chemical resistance (e.g. an etchant resistance) may be provided by an electronegativity of buried layer greater than the substrate.

According to various embodiments, the buried layer may include or be formed from at least one of a carbide (e.g. of a material of the substrate) or a nitride (e.g. of the material of the substrate).

According to various embodiments, the method may further include: removing the buried layer at least partially after the thinning According to various embodiments, the epitaxial layer may include or be formed from the material of the substrate.

According to various embodiments, forming the buried layer (e.g. in at least one of the substrate or the epitaxial layer) may include or be formed from implanting a chemical element (e.g. at least one of carbon or nitrogen) having a greater electronegativity than the substrate (e.g. into at least one of the substrate or the epitaxial layer).

According to various embodiments, forming the buried layer in the substrate may include or be formed from: forming a plurality of trenches into the substrate; at least one of implanting or disposing a chemical element (e.g. at least one of carbon or nitrogen) having a higher electronegativity than the substrate through the plurality of trenches into the substrate; filling the plurality of trenches.

According to various embodiments, thinning the substrate may include or be formed from etching (e.g. anisotropic etching).

According to various embodiments, thinning the substrate may include using an etchant, which etches the substrate faster than the buried layer. In other words, an etchant resistance of the buried layer regarding the etchant may be greater than an etchant resistance of the substrate regarding the etchant.

According to various embodiments, the method may further include contacting the second side of the substrate.

According to various embodiments, filling the plurality of trenches may include or be formed from melting the substrate partially by heating at least the first side of the substrate.

According to various embodiments, heating at least the first side of the substrate may include or be formed from using a laser.

According to various embodiments, filling the plurality of trenches may include or be formed from forming the epitaxial layer over the substrate.

According to various embodiments, the method may further include forming at least one of the following circuit components at least one of in the epitaxial layer or over the buried layer: an insulated-gate bipolar transistor, a diode, a transistor, a metal-oxide semiconductor field-effect transistor, a power metal-oxide semiconductor field-effect transistor, a circuit structure.

According to various embodiments, the method may further include forming a power circuit components at least one of in the epitaxial layer or over the buried layer.

According to various embodiments, the method may further include forming an electrical connection from the at least one circuit component to a side opposite the at least one circuit component.

According to various embodiments, the method may further include forming an electrical through contact in at least one of the substrate or the epitaxial layer, the electrical through contact electrically contacting the at least one circuit component.

According to various embodiments, the method may further forming an electrical through contact extending at least through the epitaxial layer.

According to various embodiments, the method may further forming an electrical through contact extending at least through the substrate.

According to various embodiments, the method may further forming an electrical through contact extending through at least one of the epitaxial layer, the buried layer or the substrate.

According to various embodiments, the method may further include: tempering the substrate to homogenize a composition of the buried layer.

According to various embodiments, homogenize the composition of the buried layer may include at least one of: diffusing material of the buried layer into the substrate (e.g. in a lateral direction); forming the solid state compound (e.g. at least one of carbide or nitride) in the buried layer.

According to various embodiments, forming the buried layer may include or be formed from forming a p-doped sublayer of the buried layer.

According to various embodiments, the buried layer includes or is formed from at least two sublayers differing from each other in at least a chemical composition.

According to various embodiments, the buried layer may include or be formed from at least two sublayers which at least one of differ from each other in a chemical composition or are distant from each other.

According to various embodiments, the p-doped sublayer layer may include or be formed from a group III material, e.g. boron.

According to various embodiments, removing the buried layer at least partially may include or be formed from exposing at least one of: a portion of the substrate, a p-doped sublayer of the buried layer, an epitaxial layer over the substrate.

According to various embodiments, thinning the substrate may include or be formed from at least one of: etching, or chemical-mechanical polishing.

According to various embodiments, thinning the substrate may include or be formed from at least one of: grinding, chemical-mechanical polishing, wet etching, electrochemical etching, dry etching, ion etching (e.g. reactive ion etching).

According to various embodiments, thinning the substrate may include or be formed from using an etchant to which the buried layer is inert.

According to various embodiments, thinning the substrate may include or be formed from using an etchant which is configured to etch the substrate faster than the buried layer.

According to various embodiments, thinning the substrate may include or be formed from selective etching. In other words, an etchant may be used which is configured for selective etching. Selective etching may be configured to etch one material (e.g. of the substrate) faster than another material (e.g. of the buried layer).

According to various embodiments, thinning the substrate may include using an etchant, which etches the substrate faster than the buried layer. In other words, an etchant resistance of the buried layer regarding the etchant may be greater than an etchant resistance of the substrate regarding the etchant.

According to various embodiments, the method may further include contacting the second side of the substrate.

According to various embodiments, the method may further include forming one or more electrical circuit components at least one of in or over the epitaxial layer.

According to various embodiments, the method may further include contacting the second side of the substrate.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method, comprising:
providing a substrate having a first side and a second side opposite the first side;
forming a buried layer at least one of in or over the substrate by processing the first side of the substrate,
thinning the substrate from the second side of the substrate, wherein the buried layer comprises a solid state compound having a greater resistance to the thinning than the substrate and wherein the thinning stops at the buried layer;
wherein forming the buried layer in the substrate comprises:
forming a plurality of trenches into the substrate;
introducing a chemical element having a higher electronegativity than the substrate through the plurality of trenches into the substrate; and
filling the plurality of trenches;
wherein filling the plurality of trenches comprises melting the substrate partially by heating at least the first side of the substrate.

2. The method of claim 1, further comprising:
forming an epitaxial layer over the substrate, wherein the buried layer is formed at least one of in the substrate, in the epitaxial layer, or between the substrate and the epitaxial layer.

3. The method of claim 2,
wherein the epitaxial layer comprises a material of the substrate.

4. The method of claim 2, further comprising:
forming at least one of the following circuit components in the epitaxial layer:
an insulated-gate bipolar transistor, a diode, a transistor, a metal-oxide semiconductor field-effect transistor, a power metal-oxide semiconductor field-effect transistor, or a circuit structure.

5. The method of claim 4, further comprising:
forming an electrical through contact in at least one of the substrate or the epitaxial layer, the electrical through contact electrically contacting the at least one circuit component.

6. The method of claim 2, further comprising:
forming an electrical through contact extending through at least one of the substrate, the buried layer or the epitaxial layer.

7. The method of claim 1,
wherein forming the buried layer comprises implanting a chemical element having a greater electronegativity than the substrate.

8. The method of claim 1,
wherein heating at least the first side of the substrate comprises using a laser.

9. The method of claim 1, further comprising:
tempering the substrate to homogenize a composition of the buried layer.

10. The method of claim 1,
wherein thinning the substrate comprises at least one of: etching, chemical-mechanical polishing, or grinding.

11. The method of claim 1,
wherein thinning the substrate comprises using an etchant to which the buried layer is inert.

12. The method of claim 1,
wherein the buried layer is proximate the first side of the substrate.

13. The method of claim 1,
wherein the buried layer comprises at least two sublayers which at least one of differ from each other in a chemical composition or are distant from each other.

14. The method of claim 1,
wherein the solid state compound comprises at least one of carbon, or nitrogen.

15. A method, comprising:
providing a substrate having a first side and a second side opposite the first side;
forming a buried layer at least one of in or over the substrate by processing the first side of the substrate,
thinning the substrate from the second side of the substrate, wherein the buried layer comprises a solid state compound having a greater resistance to the thinning than the substrate and wherein the thinning stops at the buried layer;
wherein forming the buried layer comprises forming a p-doped sublayer of the buried layer.

16. The method of claim 15,
wherein the p-doped sublayer layer comprises a group III material.

17. A method, comprising:
providing a substrate having a first side and a second side opposite the first side;
forming a buried layer at least one of in or over the substrate by processing the first side of the substrate,
thinning the substrate from the second side of the substrate, wherein the buried layer comprises a solid state compound having a greater resistance to the thinning than the substrate and wherein the thinning stops at the buried layer; and
removing the buried layer at least partially after the thinning;
wherein removing the buried layer at least partially comprises exposing at least one of: a portion of the substrate, a p-doped sublayer of the buried layer, an epitaxial layer over the substrate.

* * * * *